US010892227B2

(12) United States Patent
Kim et al.

(10) Patent No.: US 10,892,227 B2
(45) Date of Patent: Jan. 12, 2021

(54) FAN-OUT SEMICONDUCTOR PACKAGE

(71) Applicant: SAMSUNG ELECTRONICS CO., LTD., Suwon-si (KR)

(72) Inventors: Hyoung Joon Kim, Suwon-si (KR); Doo Hwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/441,655

(22) Filed: Feb. 24, 2017

(65) Prior Publication Data

US 2018/0096940 A1 Apr. 5, 2018

(30) Foreign Application Priority Data

Sep. 30, 2016 (KR) .................. 10-2016-0126233

(51) Int. Cl.
*H01L 23/538* (2006.01)
*H01L 23/00* (2006.01)
(Continued)

(52) U.S. Cl.
CPC .......... *H01L 23/5389* (2013.01); *H01L 23/16* (2013.01); *H01L 23/295* (2013.01); *H01L 23/3114* (2013.01); *H01L 23/3135* (2013.01); *H01L 23/5386* (2013.01); *H01L 23/562* (2013.01); *H01L 24/05* (2013.01); *H01L 24/19* (2013.01); *H01L 24/20* (2013.01); *H01L 24/24* (2013.01); *H01L 24/25* (2013.01); *H01L 23/145* (2013.01); *H01L 23/3128* (2013.01);
(Continued)

(58) Field of Classification Search
CPC ....... H01L 2924/00014; H01L 2924/00; H01L 2924/14; H01L 2924/15311; H01L 2224/0401; H01L 23/49822; H01L 24/03; H01L 24/05; H05K 3/4602; H05K 3/4661; Y10T 29/49155
USPC ................ 257/700, 737, 738, 774, E21.508, 257/E23.062, E23.069
See application file for complete search history.

(56) References Cited

U.S. PATENT DOCUMENTS 6,010,768 A * 1/2000 Yasue .................. H05K 3/0094
174/255
6,217,988 B1 4/2001 Yasue et al.
(Continued)

FOREIGN PATENT DOCUMENTS

CN 1549673 A 11/2004
CN 101442887 A 5/2009
(Continued)

OTHER PUBLICATIONS

The Engineering ToolBox, Young's Modulus—Tensile and Yield Strength for common Materials.*
(Continued)

*Primary Examiner* — David Chen
(74) *Attorney, Agent, or Firm* — Sughrue Mion, PLLC

(57) ABSTRACT

A fan-out semiconductor package is provided. A semiconductor chip is disposed in a through hole of a first connection member. At least a portion of the semiconductor chip is encapsulated by an encapsulant. A second connection member including a redistribution layer is formed on an active surface of the semiconductor chip. An external connection terminal having excellent reliability is formed on the encapsulant.

19 Claims, 13 Drawing Sheets

(51) Int. Cl.
  *H01L 23/16* (2006.01)
  *H01L 23/29* (2006.01)
  *H01L 23/31* (2006.01)
  *H01L 23/498* (2006.01)
  *H01L 23/14* (2006.01)

(52) U.S. Cl.
  CPC .... *H01L 23/49816* (2013.01); *H01L 23/5384* (2013.01); *H01L 2224/02377* (2013.01); *H01L 2224/02379* (2013.01); *H01L 2224/0401* (2013.01); *H01L 2224/04105* (2013.01); *H01L 2224/05096* (2013.01); *H01L 2224/05124* (2013.01); *H01L 2224/05557* (2013.01); *H01L 2224/05559* (2013.01); *H01L 2224/05572* (2013.01); *H01L 2224/05647* (2013.01); *H01L 2224/12105* (2013.01); *H01L 2224/13006* (2013.01); *H01L 2224/13023* (2013.01); *H01L 2224/18* (2013.01); *H01L 2224/211* (2013.01); *H01L 2224/215* (2013.01); *H01L 2224/221* (2013.01); *H01L 2224/24101* (2013.01); *H01L 2224/24155* (2013.01); *H01L 2924/0105* (2013.01); *H01L 2924/01013* (2013.01); *H01L 2924/01022* (2013.01); *H01L 2924/01028* (2013.01); *H01L 2924/01029* (2013.01); *H01L 2924/01047* (2013.01); *H01L 2924/01079* (2013.01); *H01L 2924/01082* (2013.01); *H01L 2924/05432* (2013.01); *H01L 2924/05442* (2013.01); *H01L 2924/0665* (2013.01); *H01L 2924/07025* (2013.01); *H01L 2924/10252* (2013.01); *H01L 2924/10253* (2013.01); *H01L 2924/10329* (2013.01); *H01L 2924/14* (2013.01); *H01L 2924/15153* (2013.01); *H01L 2924/186* (2013.01); *H01L 2924/19105* (2013.01); *H01L 2924/3511* (2013.01)

(56) References Cited

U.S. PATENT DOCUMENTS

| | | | |
|---|---|---|---|
| 6,294,744 B1* | 9/2001 | Kinoshita | H05K 3/381 |
| | | | 174/255 |
| 2001/0042637 A1 | 11/2001 | Hirose et al. | |
| 2007/0262336 A1* | 11/2007 | Tamaki | H01L 33/60 |
| | | | 257/98 |
| 2009/0133910 A1 | 5/2009 | Ohashi et al. | |
| 2009/0239336 A1* | 9/2009 | Lee | H01L 21/6835 |
| | | | 438/107 |
| 2009/0261466 A1* | 10/2009 | Pagaila | H01L 21/6835 |
| | | | 257/686 |
| 2011/0247208 A1* | 10/2011 | Ikeda | H01L 21/4857 |
| | | | 29/830 |
| 2012/0013021 A1 | 1/2012 | Kobayashi et al. | |
| 2012/0018879 A1 | 1/2012 | Shin et al. | |
| 2012/0153463 A1 | 6/2012 | Maeda | |
| 2012/0153493 A1* | 6/2012 | Lee | H01L 25/16 |
| | | | 257/774 |
| 2013/0075936 A1 | 3/2013 | Lin et al. | |
| 2013/0082399 A1* | 4/2013 | Kim | H01L 24/19 |
| | | | 257/774 |
| 2013/0249075 A1* | 9/2013 | Tateiwa | H05K 1/185 |
| | | | 257/734 |
| 2013/0269989 A1* | 10/2013 | Kim | H05K 1/0366 |
| | | | 174/255 |
| 2013/0319749 A1* | 12/2013 | Ohashi | H05K 3/0032 |
| | | | 174/262 |
| 2014/0103527 A1* | 4/2014 | Marimuthu | H01L 23/49833 |
| | | | 257/737 |
| 2015/0179560 A1* | 6/2015 | Arisaka | H05K 1/0313 |
| | | | 257/777 |
| 2015/0259194 A1* | 9/2015 | Lin | B81B 7/007 |
| | | | 257/773 |
| 2015/0325557 A1 | 11/2015 | Yiu et al. | |

FOREIGN PATENT DOCUMENTS

| | | |
|---|---|---|
| CN | 102573280 A | 7/2012 |
| JP | 2919644 B2 | 7/1999 |
| JP | 2002-246500 A | 8/2002 |
| JP | 2008-243925 A | 10/2008 |
| JP | 2012-39090 A | 2/2012 |
| JP | 2016-134497 A | 7/2016 |
| KR | 10-2007-0086861 A | 8/2007 |
| KR | 10-2013-0132162 A | 12/2013 |
| KR | 10-2016-0024379 A | 3/2016 |
| WO | 2012/133839 A1 | 10/2012 |
| WO | 2015/026344 A1 | 2/2015 |

OTHER PUBLICATIONS

U.S. Non-Final Office Action dated Sep. 21, 2018 issued in U.S. Appl. No. 15/716,301.
Korean Office Action dated Sep. 17, 2018 issued in Korean Patent Application No. 10-2016-012633 (with English translation).
Japanese Office Action dated Jul. 3, 2018 issued in Japanese Patent Application No. 2017-031603 (with English translation).
Office Action dated Apr. 1, 2019 issued by the United States Patent and Trademark Office in U.S. Appl. No. 15/716,301.
Communication dated Dec. 3, 2019, issued by the State Intellectual Property Office of People's Republic of China in counterpart Chinese Application No. 201710244624.1.
Office Action dated Mar. 6, 2020 issued by the United States Patent and Trademark Office in U.S. Appl. No. 15/716,301.

* cited by examiner

I-I'

FAN-OUT SEMICONDUCTOR PACKAGE

CROSS-REFERENCE TO RELATED APPLICATION

This application claims the benefit of priority to Korean Patent Application No. 10-2016-0126233, filed on Sep. 30, 2016 with the Korean Intellectual Property Office, the entirety of which is incorporated herein by reference.

TECHNICAL FIELD

The present disclosure relates to a fan-out semiconductor package, in which a connection terminal may extend outwardly of a region in which a semiconductor chip is disposed.

BACKGROUND

Recently, a significant trend in the development of technology related to semiconductor chips is reducing the size of electronic components. Hence, in the field of packaging, in accordance with a rapid increase in demand for compact semiconductor chips, or the like, the implementation of an electronic component package having a compact size and including a plurality of pins has been demanded.

One package technology proposed to meet the demand for compact semiconductor chips is fan-out semiconductor package technology. Fan-out semiconductor package technology may allow connection terminals to be redistributed outwardly of a region in which semiconductor chips are disposed, thereby having a compact size and allowing a plurality of pins to be implemented.

SUMMARY

An aspect of the present disclosure may provide a fan-out semiconductor package, in which an external connection terminal formed in an upper portion thereof may have excellent reliability.

According to an aspect of the present disclosure, a fan-out semiconductor package includes: a first connection member having a through hole; a semiconductor chip disposed in the through hole, and having an active surface having a connection pad disposed thereon and an inactive surface opposing the active surface; an encapsulant encapsulating at least portions of the first connection member and the inactive surface of the semiconductor chip; a second connection member disposed on the first connection member and the active surface of the semiconductor chip; an opening passing through the encapsulant; and an external connection terminal filling at least a portion of the opening. The first connection member and the second connection member include redistribution layers electrically connected to the connection pad of the semiconductor chip, respectively. The redistribution layer of the first connection member includes a pad having at least a portion exposed by the opening to be connected to the external connection terminal. A wall surface of the opening has a surface roughness greater than a surface roughness of an exposed surface of the pad.

According to an aspect of the present disclosure, a fan-out semiconductor package includes: a first connection member having a through hole; a semiconductor chip disposed in the through hole, and having an active surface having a connection pad disposed thereon and an inactive surface opposing the active surface; an encapsulant encapsulating at least portions of the first connection member and the inactive surface of the semiconductor chip; a second connection member disposed on the first connection member and the active surface of the semiconductor chip; a reinforcing layer disposed on the encapsulant, and having an opening; and an external connection terminal filling at least a portion of the opening. The first connection member and the second connection member include redistribution layers electrically connected to the connection pad of the semiconductor chip, respectively. A wall surface of the opening includes a void filled with a portion of the external connection terminal.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
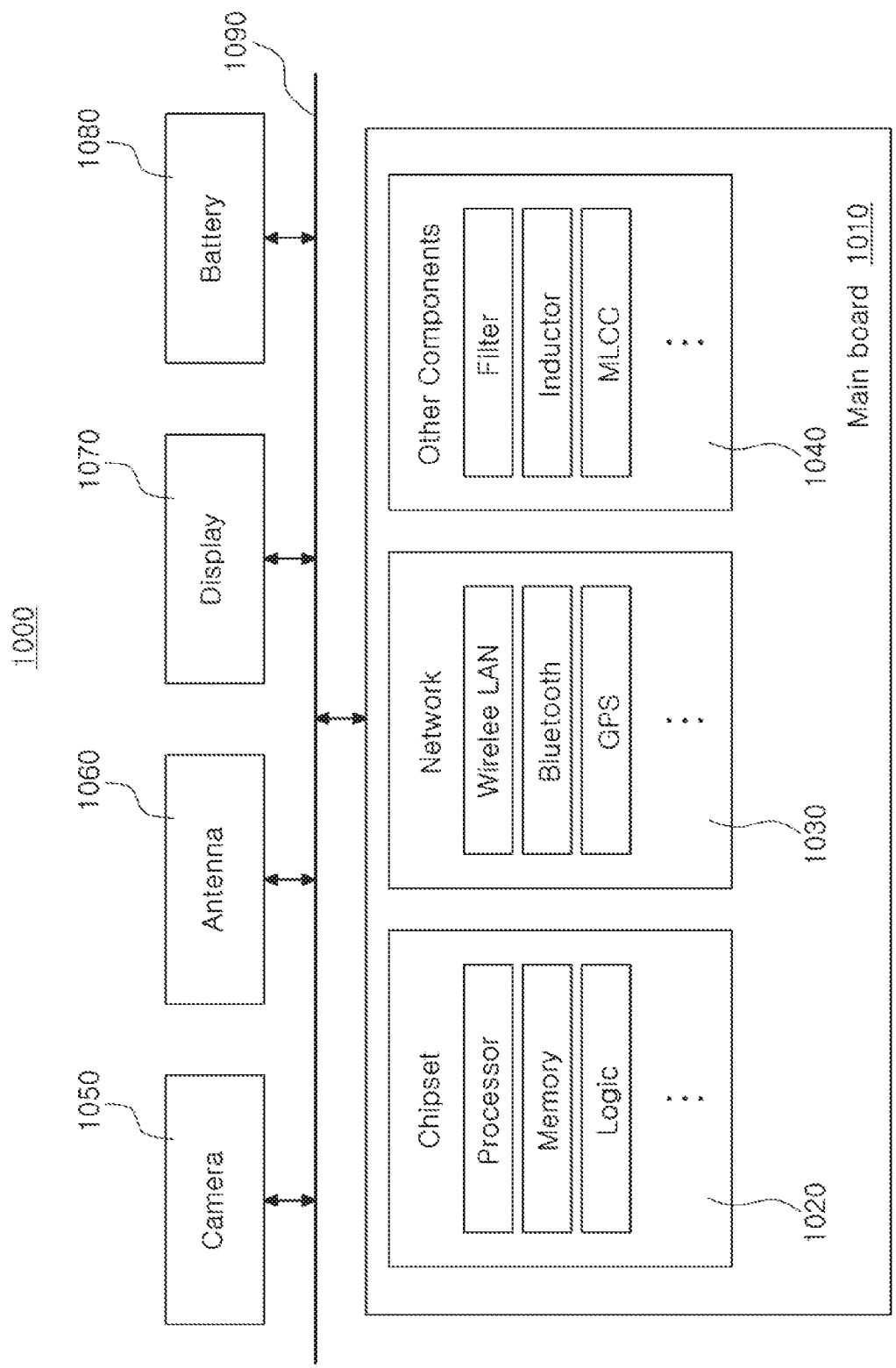
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone or as a combination thereof.

The contents of the present disclosure described below may have a variety of configurations and only a required configuration is proposed herein, but the present disclosure is not limited thereto.

Electronic Device

FIG. 1 is a schematic block diagram illustrating an example of an electronic device system.

Referring to FIG. 1, an electronic device 1000 may receive a main board 1010. The main board 1010 may include chip-related components 1020, network-related components 1030, other components 1040, or the like, physically or electrically connected to one another. These components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphic processor (for example, a graphic processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip-related components 1020 are not limited thereto, but may also include other types of chip-related components. In addition, the chip-related components 1020 may be combined with each other.

The network-related components 1030 may include protocols such as wireless fidelity (Wi-Fi) (institute of electrical and electronics engineers (IEEE) 802.11 standard family, or the like), worldwide interoperability for microwave access (WiMAX) (IEEE 802.16 standard family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network-related components 1030 are not limited thereto, but may also include a variety of other wireless or wired standards or protocols. In addition, the network-related components 1030 may be combined with each other, together with the chip-related components 1020.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030 described above.

According to a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes, according to a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video games machine, a smartwatch, or an automobile part. However, the electronic device 1000 is not limited thereto, and may be any other electronic device able to process data.

Figure 2:
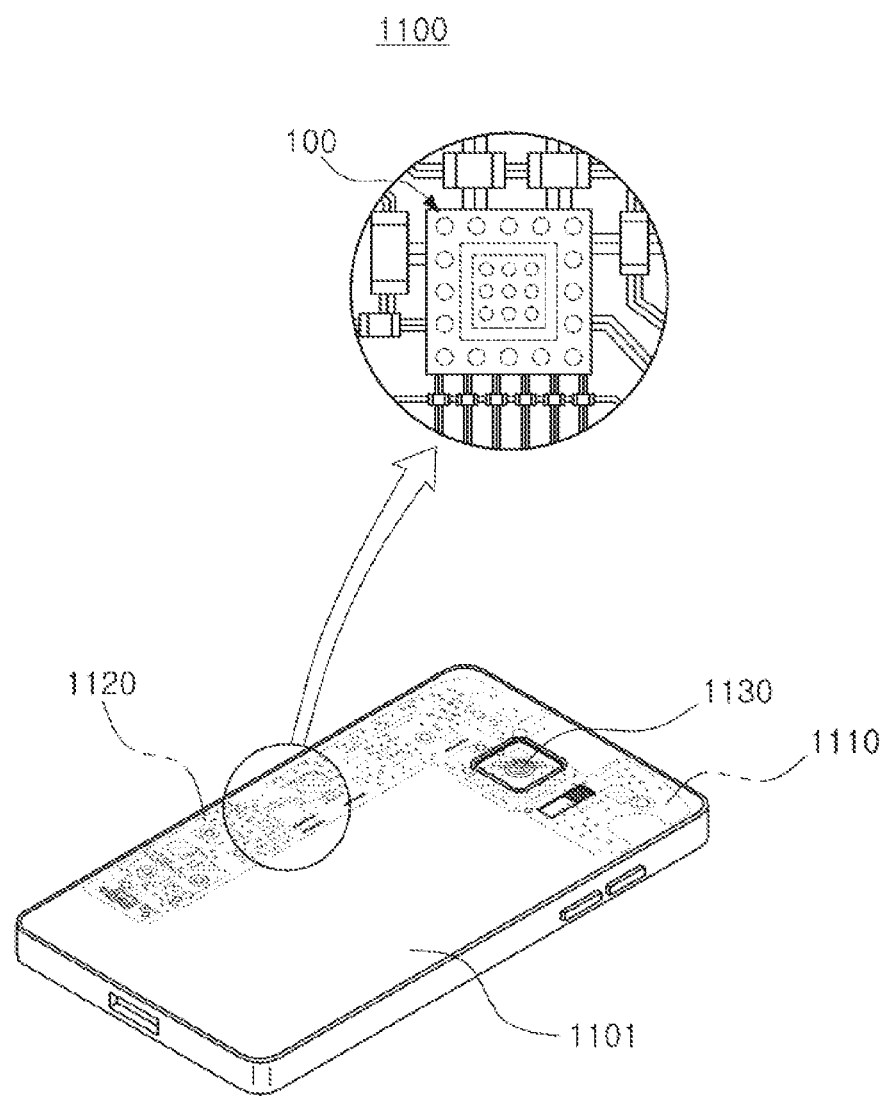
FIG. 2 is a schematic perspective view illustrating an example of an electronic device.

FIG. 2 is a schematic perspective view illustrating an example of an electronic device.

Referring to FIG. 2, a semiconductor package 100 may be applied to various types of electronic devices as described above for various purposes. For example, a main board 1110 may be accommodated in a body portion 1101 of a smartphone 1100, and various types of electronic components 1120 may be physically or electrically connected to the main board 1110. In addition, other components that may or may not be physically or electrically connected to the main board 1110, such as a camera module 1130 and the like, may be accommodated in the body portion 1101. A portion of the electronic components 1120 may be chip-related components as described above, and the semiconductor package 100 may be, for example, an application processor among the chip-related components, but is not limited thereto. An electronic device is not limited to the smartphone 1100, and may be other electronic device as described above.

Semiconductor Package

In general, a semiconductor chip may have numerous electric circuits integrated therein. However, the semiconductor chip itself may not function as a finished semiconductor product, and may be likely to be damaged by an external physical or chemical impact. Therefore, without being used as is, the semiconductor chip itself may be packaged, and may then be used in an electronic device or the like in a packaged state.

Semiconductor packaging may be required because a circuit width of a semiconductor chip is different from that of a main board of the electronic device, in terms of an electrical connection. In detail, in the case of the semiconductor chip, a size of connection pads and a spacing therebetween may be microscopic, whereas in the case of the main board used in the electronic device, a size of electronic component mounting pads and a spacing therebetween may be far greater than a scale of the semiconductor chip. Thus, it may be difficult to directly mount the semiconductor chip on such a main board, and thus, a packaging technology may be required to reduce the difference between the circuit widths of the semiconductor chip and the main board of the electronic device.

A semiconductor package manufactured using such a packaging technology may be divided into a fan-in semiconductor package and a fan-out semiconductor package, according to a structure and purpose of the semiconductor package.

Hereinafter, the fan-in semiconductor package and the fan-out semiconductor package may be detailed with reference to the drawings.

Fan-In Semiconductor Package

Figure 3B:
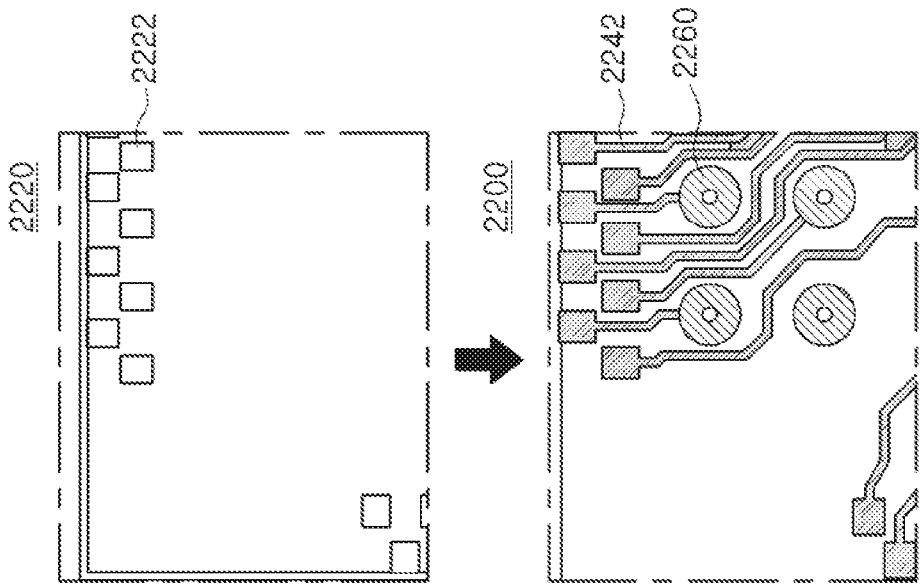
FIG. 3B shows a schematic cross-sectional view and a schematic plan views of a fan-in semiconductor package before and after packaging thereof.
Figure 3A:
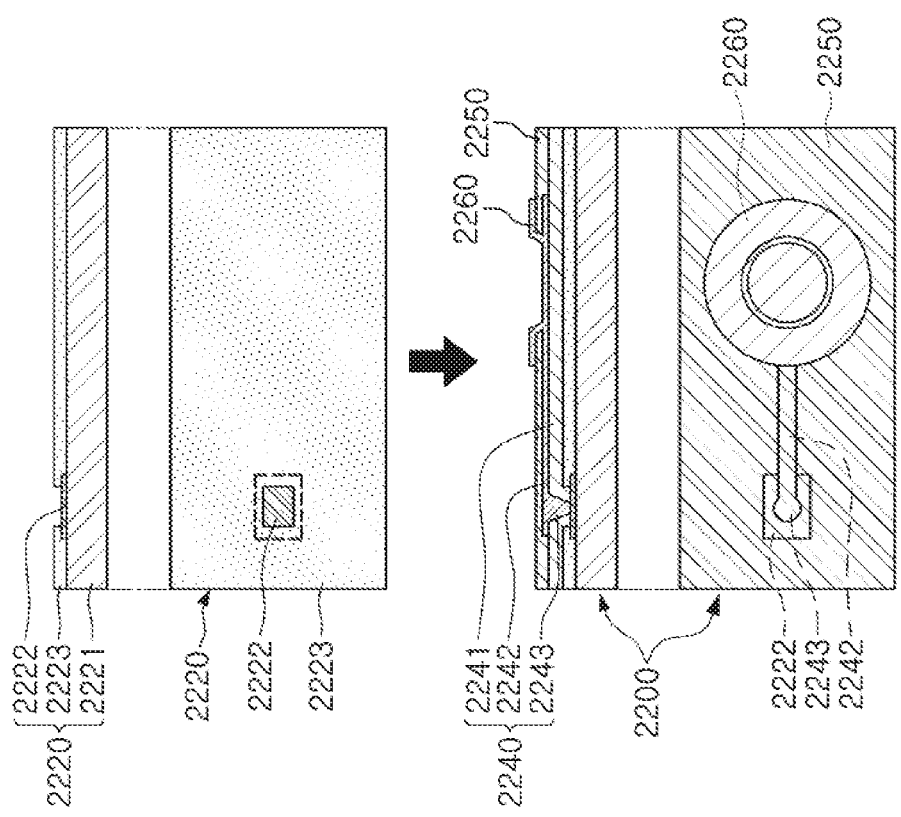
FIG. 3A shows a schematic cross-sectional view and a schematic plan view of a fan-in semiconductor package before and after packaging thereof.

FIG. 3A is schematic cross-sectional views and schematic plan views of a fan-in semiconductor package before and after packaging thereof. FIG. 3B is schematic cross-sectional views and schematic plan views of a fan-in semiconductor package before and after packaging thereof.

Figure 4:
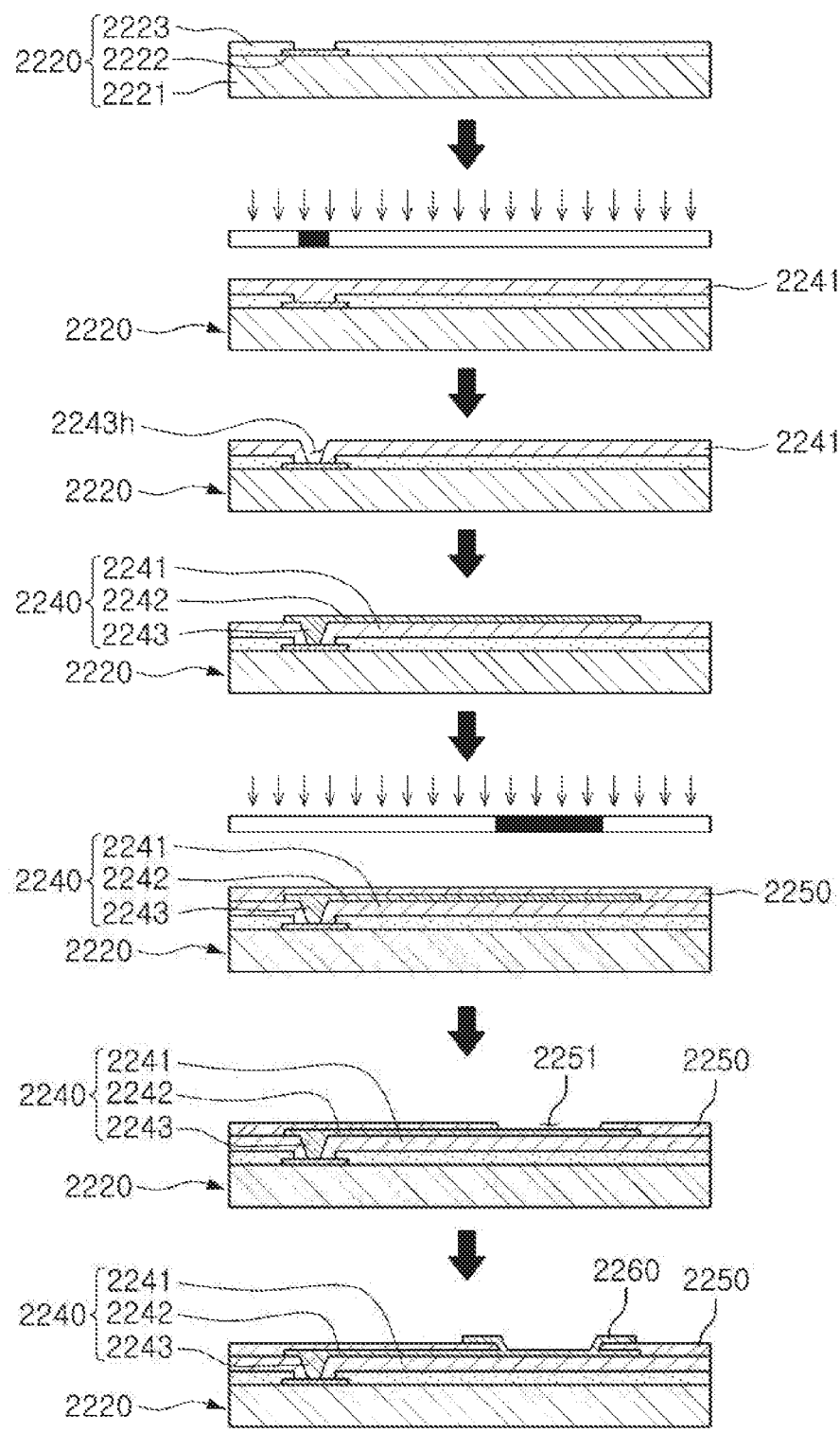
FIG. 4 is schematic cross-sectional views illustrating a process of packaging a fan-in semiconductor package.

FIG. 4 is schematic cross-sectional views illustrating a process of packaging a fan-in semiconductor package.

Referring to the drawings, a semiconductor chip 2220 may be, for example, an integrated circuit (IC) in a bare state. The IC may include a body portion 2221 including silicon (Si), germanium (Ge), or gallium arsenide (GaAs), a connection pad 2222 formed on one surface of the body portion 2221, and including a conductive material such as aluminum (Al), and a passivation film 2223 such as an oxide film or a nitride film formed on one surface of the body portion 2221, and covering at least a portion of the connection pad 2222. Here, the connection pad 2222 may be significantly small, and it may thus be difficult to mount the IC on a printed circuit board (PCB) on an intermediate level, as well as on a main board or the like of an electronic device.

In order to redistribute the connection pad 2222, a connection member 2240 may be formed on the semiconductor chip 2220, according to a size of the semiconductor chip 2220. The connection member 2240 may be formed by forming an insulating layer 2241 on the semiconductor chip 2220 using an insulating material such as a photosensitive insulating resin (PID), forming a via hole 2243*h* exposing the connection pad 2222 in the insulating layer 2241, and forming a redistribution layer 2242 and a via 2243. Then, a passivation layer 2250 protecting the connection member 2240 may be formed, an opening 2251 may be formed, and an under-bump metal layer 2260 may be formed. Through a series of processes, for example, a fan-in semiconductor package 2200 including the semiconductor chip 2220, the connection member 2240, the passivation layer 2250, and the under-bump metal layer 2260 may be manufactured.

As described above, a fan-in semiconductor package may be manufactured in package form in which a connection pad of a semiconductor chip, for example, input/output (I/O) terminals are all disposed inside a device, may have good electrical characteristics, and may be produced at low cost. Thus, many devices provided in a smartphone may be manufactured in fan-in semiconductor package form, and in detail, may have been developed in a manner in which the devices may quickly transmit signals while having a compact size.

Merely, the fan-in semiconductor package may be required to have all I/O terminals disposed inside the semiconductor chip to thus have many constraints on space. Therefore, it may be difficult to apply such a structure to a semiconductor chip having a large number of I/O terminals or a small-sized semiconductor chip. In addition, such a weak point may cause the fan-in semiconductor package not to be able to be directly mounted on the main board of the electronic device. Even when the I/O terminals of the semiconductor chip are expanded in size and at intervals by a redistribution process, the fan-in semiconductor package may not have a size or an interval sufficient to be directly mounted on the main board of the electronic device.

Figure 5:
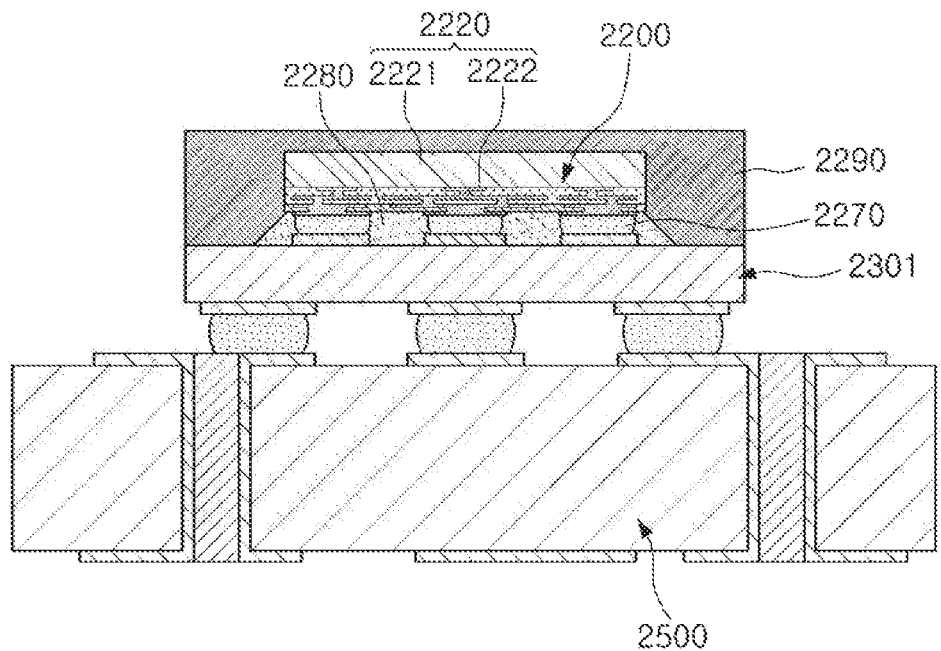
FIG. 5 is a schematic cross-sectional view of a fan-in semiconductor package mounted on an interposer substrate and ultimately mounted on a main board of an electronic device.

FIG. 5 is a schematic cross-sectional view of a fan-in semiconductor package mounted on an interposer substrate and ultimately mounted on a main board of an electronic device.

Figure 6:
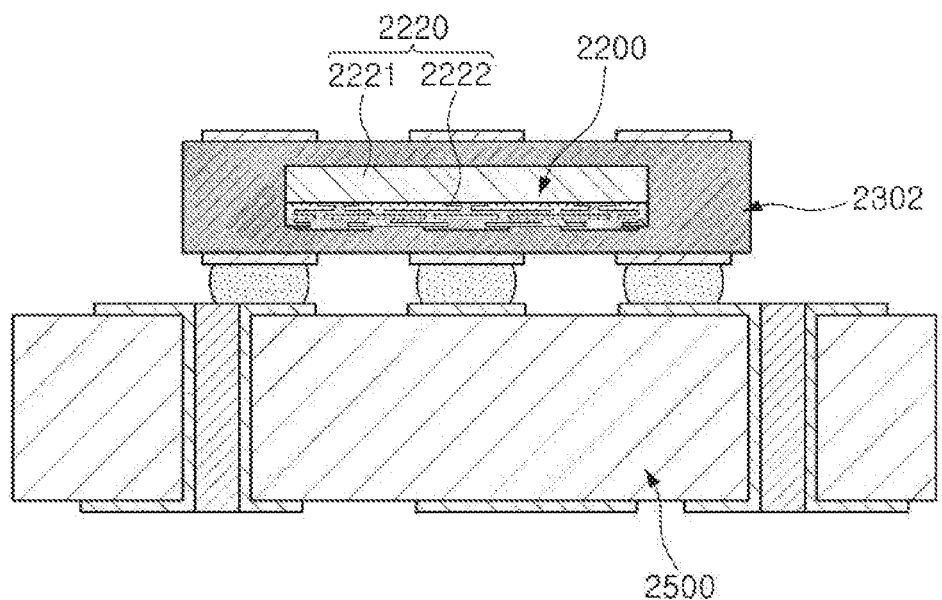
FIG. 6 is a schematic cross-sectional view of a fan-in semiconductor package mounted within an interposer substrate and ultimately mounted on a main board of an electronic device.

FIG. 6 is a schematic cross-sectional view of a fan-in semiconductor package mounted within an interposer substrate and ultimately mounted on a main board of an electronic device.

Referring to the drawings, in a fan-in semiconductor package 2200, connection pads 2222 of a semiconductor chip 2220, for example, I/O terminals, may be redistributed by an interposer substrate 2301. Finally, the fan-in semiconductor package 2200 may be mounted on a main board 2500 of an electronic device while being mounted on the interposer substrate 2301. Here, a solder ball 2270 or the like may be fixed by an underfill resin 2280 or the like, and external surfaces of the underfill resin 2280 may be covered by a molding material 2290 or the like. Alternatively, the fan-in semiconductor package 2200 may be embedded within a separate interposer substrate 2302, the connection pads 2222 of a semiconductor chip 2220, for example, I/O terminals, may be redistributed by the interposer substrate 2302 while the fan-in semiconductor package 2200 is embedded within the interposer substrate 2302, and the fan-in semiconductor package 2200 may be ultimately mounted on the main board 2500 of the electronic device.

As described above, it may be difficult to directly mount a fan-in semiconductor package on a main board of an electronic device, and thus, the fan-in semiconductor package may be mounted on a separate interposer substrate and then mounted on the main board of the electronic device by a packaging process, or may be mounted on a main board of an electronic device while being embedded within an interposer substrate.

Fan-Out Semiconductor Package

Figure 7:
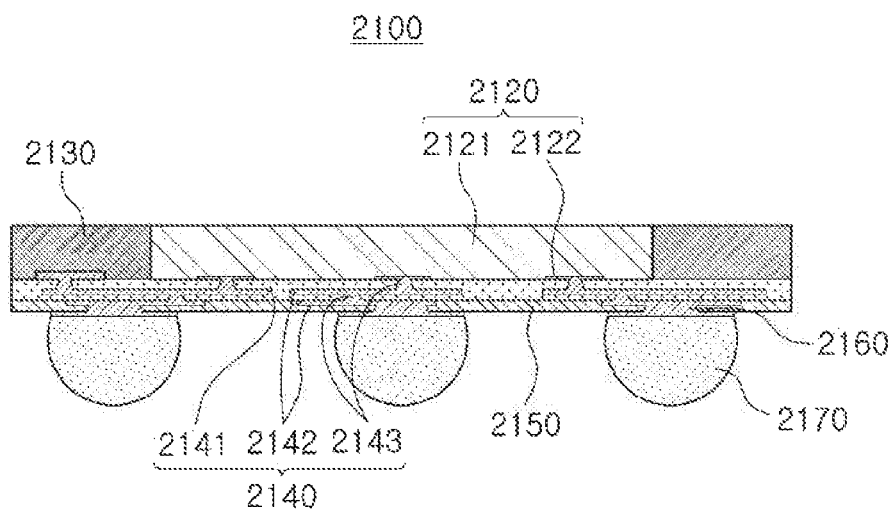
FIG. 7 is a schematic cross-sectional view of a fan-out semiconductor package.

FIG. 7 is a schematic cross-sectional view of a fan-out semiconductor package.

Referring to the drawings, in a fan-out semiconductor package 2100, for example, external surfaces of a semiconductor chip 2120 may be protected by an encapsulant 2130, and a connection pad 2122 of the semiconductor chip 2120 may be redistributed outwardly of the semiconductor chip 2120 by a connection member 2140. Here, a passivation layer 2150 may further be formed on the connection member 2140, and an under-bump metal layer 2160 may further be formed in an opening of the passivation layer 2150. A solder ball 2170 may further be formed on the under-bump metal layer 2160. The semiconductor chip 2120 may be an IC, including a body portion 2121, a connection pad 2122, and a passivation layer (not illustrated). The connection member 2140 may include an insulating layer 2141, a redistribution layer 2142 formed on the insulating layer 2141, and a via 2143 electrically connecting the connection pad 2122 to the redistribution layer 2142.

A fan-out semiconductor package may have I/O terminals redistributed outwardly of a semiconductor chip by a connection member formed on the semiconductor chip. As described above, in the fan-in semiconductor package, all I/O terminals of the semiconductor chip may be required to be disposed inside the semiconductor chip, and accordingly, when a device size is decreased, a ball size or a ball pitch may be required to be reduced. As a result, a standardized ball layout may not be used in the fan-in semiconductor package. Conversely, the fan-out semiconductor package may have the I/O terminals redistributed outwardly of the semiconductor chip by the connection member formed on the semiconductor chip as described above, and thus, even when a size of the semiconductor chip is decreased, a standardized ball layout may be used in the fan-out semiconductor package as is. As a result, the fan-out semiconductor package may be mounted on a main board of an electronic device without using a separate interposer.

Figure 8:
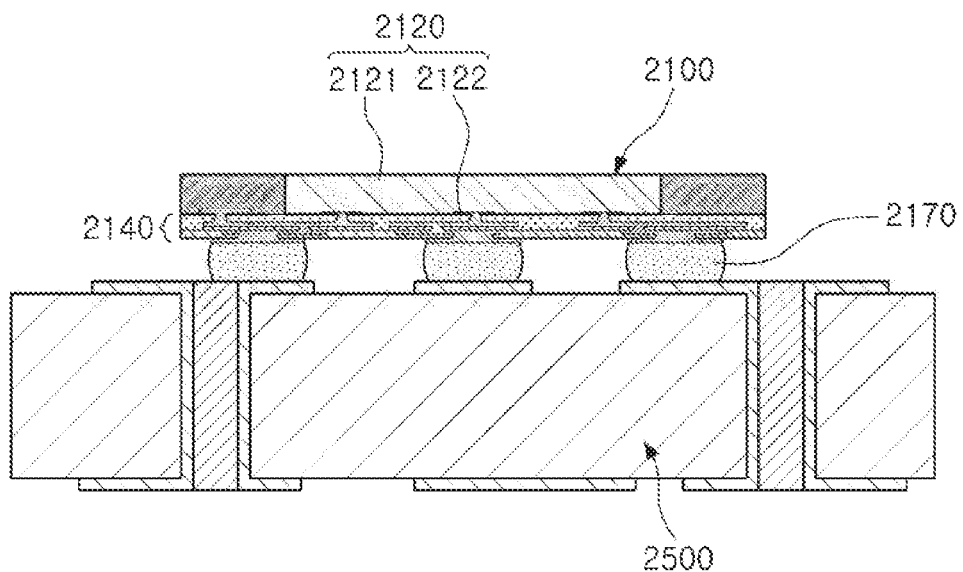
FIG. 8 is a schematic cross-sectional view of a fan-out semiconductor package mounted on a main board of an electronic device.

FIG. 8 is a schematic cross-sectional view of a fan-out semiconductor package mounted on a main board of an electronic device.

Referring to the drawings, a fan-out semiconductor package 2100 may be mounted on a main board 2500 of an electronic device by a solder ball 2170 or the like. For example, as described above, the fan-out semiconductor package 2100 may have a connection member 2240 formed on the semiconductor chip 2120 to redistribute a connection pad 2122 to a fan-out region in a range outside of a size range of a semiconductor chip 2120, and thus, a standardized ball layout may be used in the fan-out semiconductor package 2100 as is. As a result, the fan-out semiconductor package 2100 may be mounted on the main board 2500 of the electronic device without using a separate interposer substrate.

The fan-out semiconductor package may be mounted on the main board of the electronic device without using a separate interposer substrate, and thus, a thickness of the fan-out semiconductor package may be reduced as compared to that of the fan-in semiconductor package using a separate interposer substrate. As a result, the fan-out semiconductor package may be miniaturized and thinned. In addition, the fan-out semiconductor package may have excellent thermal and electrical characteristics to thus be particularly suitable for a mobile product. Furthermore, the fan-out semiconductor package may be implemented to be more compact than a common package on package (POP) type fan-out semiconductor package using a PCB, and may address issues due to a warpage phenomenon.

The fan-out semiconductor package may refer to a package technology for mounting the semiconductor chip on the main board of the electronic device, or protecting the semiconductor chip from external impact, and may be different from a PCB such as an interposer substrate having a scale and purpose different from those of the fan-out semiconductor package, and having a fan-in semiconductor package embedded therein.

Hereinafter, a fan-out semiconductor package having an external connection terminal formed on an upper portion thereof, and having excellent reliability will be described with reference to the drawings.

Figure 9:
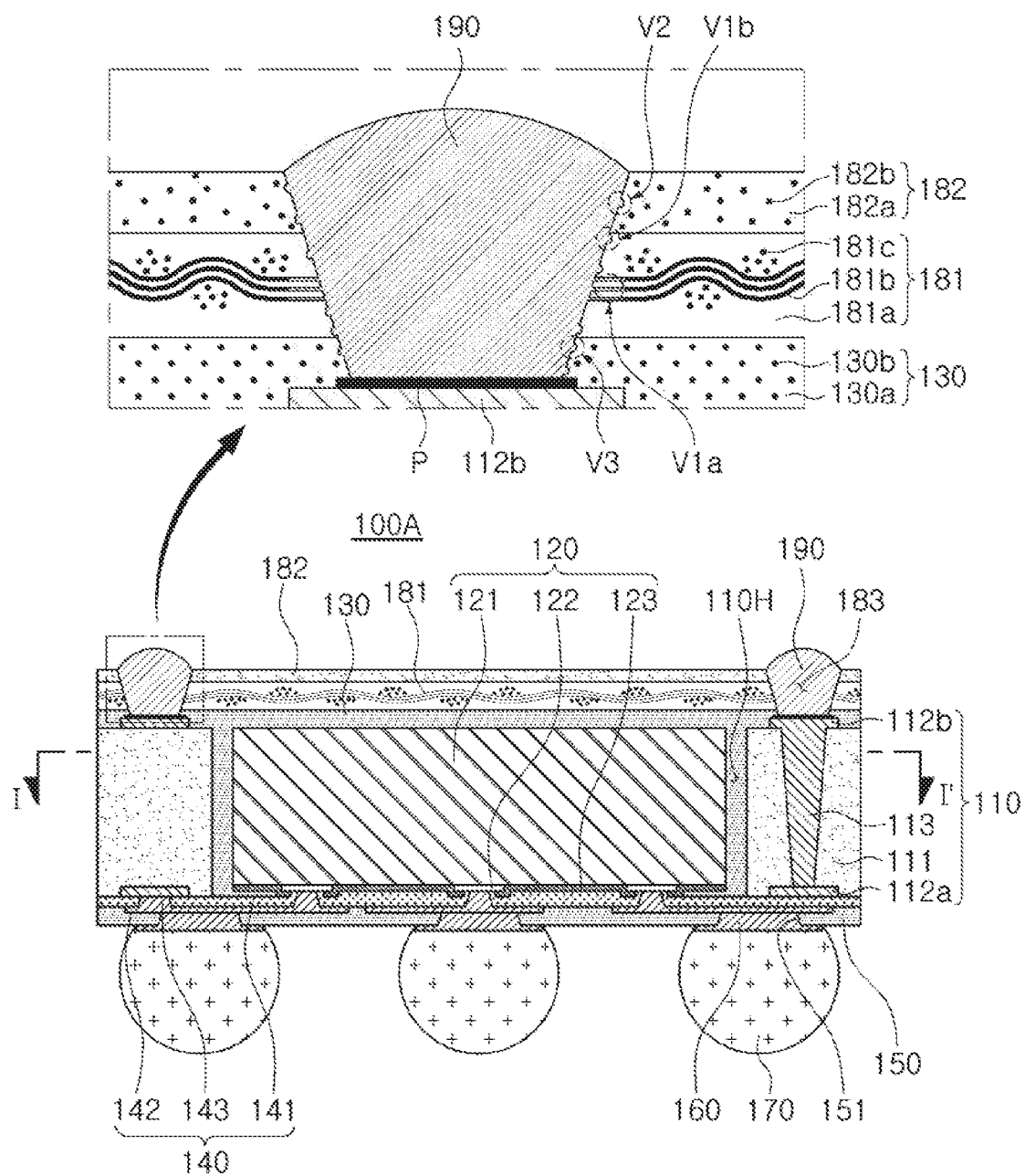
FIG. 9 is a schematic cross-sectional view illustrating an example of a fan-out semiconductor package.

FIG. 9 is a schematic cross-sectional view illustrating an example of a fan-out semiconductor package.

Figure 10:
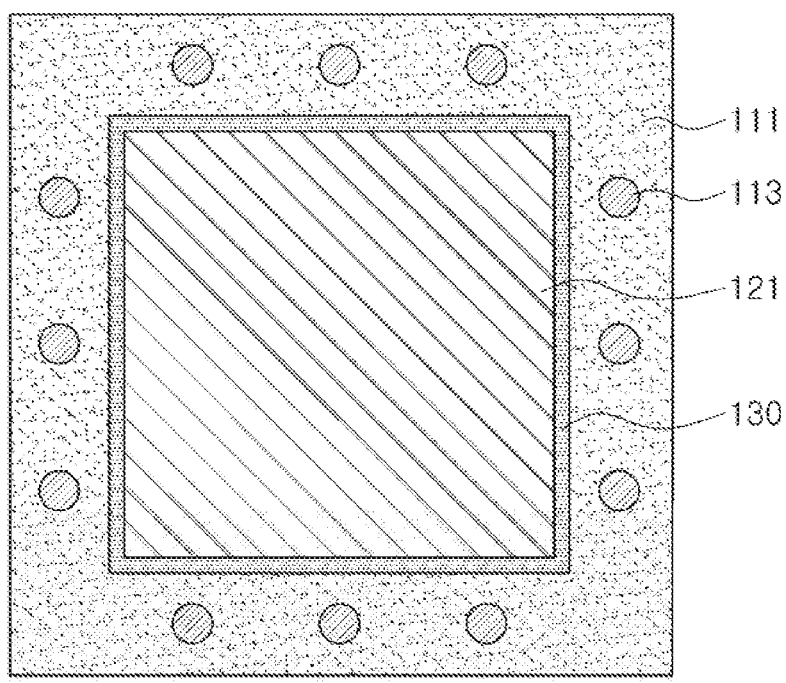
FIG. 10 is a schematic cut plan view taken along line I-I' of FIG. 9.

FIG. 10 is a schematic cut plan view taken along line I-I' of the fan-out semiconductor package of FIG. 9.

Referring to the drawings, a fan-out semiconductor package 100A according to an example may include a first connection member 110 having a through hole 110H, a semiconductor chip 120 disposed in the through hole 110H of the first connection member 110, and having an active surface having a connection pad 122 disposed thereon, and an inactive surface opposing the active surface, an encapsulant 130 encapsulating at least portions of the first connection member 110 and the inactive surface of the semiconductor chip 120, a second connection member 140 disposed on the first connection member 110 and the active surface of the semiconductor chip 120, a reinforcing layer 181 disposed on the encapsulant 130, an opening 183 passing through the encapsulant 130 and the reinforcing layer 181, and an external connection terminal 190 filling at least a portion of the opening 183. First and second redistribution layers 112a and 112b of the first connection member 110 and a redistribution layer 142 of the second connection member 140 may be electrically connected to the connection pad 122 of the semiconductor chip 120. The second redistribution layer 112b of the first connection member 110 may have at least a portion exposed by the opening 183, and may include a pad connected to the external connection terminal 190. Surface roughness of a wall surface of the opening 183 may be greater than that of an exposed surface of the pad connected to the external connection terminal 190.

Recently, a POP structure, in which the same type of packages or different types of packages having a pattern structure that transmits a signal to a semiconductor package in a vertical manner in order to expand memory capacity or improve operational performance of a semiconductor are vertically stacked, have been developed in various ways. For example, a POP structure may be formed by stacking an interposer substrate, on which a memory chip is mounted, on a semiconductor package manufactured using a wafer as a basis, and electrically connecting the interposer substrate to the semiconductor package using an external connection terminal such as a solder bump or the like. However, an external connection terminal such as a solder bump commonly formed on an upper portion of a lower semiconductor package may have insufficient reliability in a harsh environment to cause component yield to be reduced.

In contrast, in the fan-out semiconductor package 100A according to an example, the surface roughness of the wall surface of the opening 183 may be relatively greater than that of the exposed surface of the pad. Because the pad includes a metallic material, reliability at an interface between the pad, and the external connection terminal 190 including a metallic material may be unproblematic. Conversely, because the reinforcing layer 181 includes a resin material, reliability at an interface between the reinforcing layer 181, and the external connection terminal 190 including the metallic material may be problematic. Thus, it may be preferable that the surface roughness of the wall surface of the opening 183 is relatively greater than that of the exposed surface of the pad. In this case, connecting force between the wall surface of the opening 183 and the external connection terminal 190 may be increased, resulting in an improvement in reliability at the interface in a reliability test such as a TCoB test or a drop test. Surface roughness may be measured by a known method.

Meanwhile, in order to relatively increase the surface roughness of the wall surface of the opening 183, voids V1a and V1b may be formed in the opening 183 passing through the reinforcing layer 181. In this case, the external connection terminal 190 such as a solder bump formed in the opening 183 may fill at least portions of the voids V1a and V1b during a reflow process. The voids V1a and V1b, into which the external connection terminal 190 flows, may form an anchoring structure, and thus, reliability of the fan-out semiconductor package 100A may be increased by preventing the external connection terminal 190 from being separated from the wall surface of the opening 183 even in a harsh environment in which thermal or mechanical stress takes place. For example, the reliability at the interface may be increased in a reliability test such as a TCoB test or a drop test.

Meanwhile, a material including an insulating resin 181a, a core 181b, and a filler 181c may be used as the reinforcing layer 181. In this case, at least one of the voids V1a and V1b may be a recess formed in the core 181b by removing at least a portion of the core 181b, and additionally, at least the other of the voids V1a and V1b may be a recess formed in the insulating resin 181a by removing at least a portion of the filler 181c dispersed in the insulating resin 181a. The void V1a, formed by removing the core 181b, may allow for a particularly excellent anchoring effect. In addition, the void V1b, formed by removing the filler 181c, may allow the anchoring effect to be further increased. Here, the insulating resin 181a may be a thermosetting resin such as an epoxy resin, or a thermoplastic resin such as polyimide. The core 181b may be glass fiber, glass cloth, or glass fabric. The filler 181c may be an inorganic filler such as silica or alumina.

If necessary, a resin layer 182 may be further disposed on the reinforcing layer 181. The resin layer 182 may be provided to facilitate easier formation of the opening 183. In this respect, the opening 183 may pass through the resin layer 182, and a void V2 having at least a portion filled with a portion of the external connection terminal 190 may be present in wall surfaces of the resin layer 182 through which the opening 183 passes. Due to the presence of the void V2, the anchoring effect may be further increased. The resin layer 182 may include an insulating resin 182a and a filler 182b, and the void V2 may be a recess formed in the resin layer 182 by removing at least a portion of the filler 182b dispersed in the resin layer 182. The insulating resin 182a may be a thermosetting resin such as an epoxy resin, or a thermoplastic resin such as polyimide. The filler 182b may be an inorganic filler such as silica or alumina.

If necessary, a void V3 having at least a portion filled with a portion of the external connection terminal 190 may be present in wall surfaces of the encapsulant 130 formed by the opening 183 passing through the encapsulant 130. Due to the presence of the void V3, the anchoring effect may be further increased. The encapsulant 130 may include an insulating resin 130a and a filler 130b, and the void V3 may be a recess formed in the encapsulant 130 by removing at least a portion of the filler 130b dispersed in the encapsulating 130. The insulating resin 130a may be a thermosetting resin such as an epoxy resin, or a thermoplastic resin such as polyimide. The filler 130b may be an inorganic filler such as silica or alumina. A depth of one of the voids V1a and V1b formed in the core 181b may be greater than those of other voids formed in the layers other than the core 181b to allow the portion of the external connection terminal 190 fills deeper than other portions thereof.

Hereinafter, the respective components included in the fan-out semiconductor package 100A according to an example will be further detailed.

The first connection member 110 may include the first and second redistribution layers 112a and 112b redistributing the connection pad 122 of the semiconductor chip 120, and thus, the number of the insulating layer 141, the redistribution layer 142, and the via 143 of the second connection member 140 may be decreased. If necessary, the first connection member 110 may maintain rigidity of the fan-out semiconductor package 100A according to materials thereof, and may serve to ensure a uniform thickness of the encapsulant 130. The first connection member 110 may allow the fan-out semiconductor package 100A according to an example to be used as a portion of a POP structure. The first connection member 110 may have the through hole 110H. Within the through hole 110H, the semiconductor chip 120 may be spaced apart from the first connection member 110 at a distance. The periphery of side surfaces of the semiconductor chip 120 may be enclosed by the first connection member 110. This is merely exemplary. The semiconductor chip 120 may be modified to have other forms in various manners, and may perform other functions, according to the other forms.

The first connection member 110 may include the insulating layer 111 contacting the second connection member 140, the first redistribution layer 112a contacting the second connection member 140 and embedded in the insulating layer 111, and the second redistribution layer 112b opposing the first redistribution layer 112a. The first connection member 110 may include a via 113 passing through the insulating layer 111, and electrically connecting the first and second redistribution layers 112a and 112b to each other. The first and second redistribution layers 112a and 112b may be electrically connected to the connection pad 122. When the first redistribution layer 112a is embedded in the insulating layer 111, a step portion generated by a thickness of the first redistribution layer 112a may be significantly reduced, and thus, an insulating distance of the second connection member 140 may become constant. For example, a difference between a distance from the redistribution layer 142 of the second connection member 140 to a lower surface of the insulating layer 111 and a distance from the redistribution layer 142 of the second connection member 140 to the connection pad 122 may be less than the thickness of the first redistribution layer 112a. In this case, a high-density wiring design of the second connection member 140 may be facilitated.

A material of the insulating layer 111 is not particularly limited. For example, an insulating material may be used as the material of the insulating layer 111. The insulating material may be a thermosetting resin such as an epoxy resin, a thermoplastic resin such as polyimide, and an insulating material such as a prepreg, an Ajinomoto build-up film (ABF), a FR-4 resin, or a bismaleimide triazine (BT) resin, in which the thermosetting resin and the thermoplastic resin are impregnated into a core such as an inorganic filler, glass fiber, glass cloth, or glass fabric. If necessary, the material of the insulating layer 111 may also be a photoimageable dielectric (PID) resin.

The first and second redistribution layers 112a and 112b may serve to redistribute the connection pad 122 of the semiconductor chip 120. A material of the first and second redistribution layers 112a and 112b may be a conductive material such as copper (Cu), aluminum (Al), silver (Ag), tin (Sn), gold (Au), nickel (Ni), lead (Pb), titanium (Ti), or alloys thereof. The first and second redistribution layers 112a and 112b may perform various functions, depending on designs thereof. For example, the first and second redistribution layers 112a and 112b may include a ground (GND) pattern, a power (PWR) pattern, a signal (S) pattern, or the like. Here, the S pattern may include various signals, for example, data signals or the like, except for a GND pattern, a PWR pattern, or the like. In addition, the first and second redistribution layers 112a and 112b may include a via pad, an external connection terminal pad, or the like.

Meanwhile, at least a portion of the pad of the second redistribution layer 112b may be exposed by the opening 183, and a surface treatment layer P may be formed on the exposed at least a portion of the pad, if necessary. The surface treatment layer P is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like. Meanwhile, the exposed at least a portion of the pad may be electrically connected to the external connection terminal 190. Even when the surface treatment layer P is formed on the exposed at least a portion of the pad, apart from the surface treatment layer P being actually and externally exposed, it may be determined that the at least a portion of the pad may be exposed by the opening 183 to clearly understand what is exposed by the opening 183.

The via 113 may electrically connect the first and second redistribution layers 112a and 112b, formed in different layers, to each other, resulting in formation of an electrical path in the first connection member 110. A material of the via 113 may be a conductive material. The via 113 may be fully filled with the conductive material, or the conductive material may also be formed along a wall surface of the via 113. In addition, the via 113 may have all shapes known in the related art, such as a tapered shape, a cylindrical shape, or the like. When a hole for the via 113 is formed, a pad disposed on a portion of the first redistribution layer 112a may serve as a stopper, and thus, it may be beneficial that the via 113 has a tapered shape in which a width of an upper surface thereof is greater than that of a lower surface thereof in terms of a process. In this case, the via 113 may be integrated with a portion of the second redistribution layer 112b.

The semiconductor chip 120 may be an IC provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed using an active wafer as a base. In this case, a base material forming the body portion 121 may be silicon (Si), germanium (Ge), gallium arsenide (GaAs), or the like. The body portion 121 may have various types of circuits formed therein. The connection pad 122 may electrically connect the semiconductor chip 120 to another component, and may be formed of a conductive material such as aluminum (Al) or the like without a particular limit. The body portion 121 may have a passivation film 123 formed thereon to allow the connection pad 122 to be exposed, and the passivation film 123 may be an oxide film, a nitride film, or a dual layer of an oxide film and a nitride film. The passivation film 123 may allow a lower surface of the connection pad 122 to be stepped with a lower surface of the encapsulant 130, resulting in preventing the encapsulant 130 from bleeding to the lower surface of the connection pad 122 to some extent. An insulating film (not illustrated) may further be disposed on other required positions.

The inactive surface of the semiconductor chip 120 may be positioned below an upper surface of the second redistribution layer 112b of the first connection member 110. For example, the inactive surface of the semiconductor chip 120 may be positioned below an upper surface of the insulating layer 111 of the first connection member 110. A height difference between the inactive surface of the semiconductor chip 120 and the upper surface of the second redistribution layer 112b of the first connection member 110 may be 2 μm or greater, for example, 5 μm or greater. Here, cracks may be effectively prevented from being generated in corners of the inactive surface of the semiconductor chip 120. In addition, when the encapsulant 130 is applied to the semiconductor chip 120, a variation in an insulating distance from the inactive surface of the semiconductor chip 120 may be significantly reduced.

The encapsulant 130 may protect the first connection member 110 or the semiconductor chip 120. An encapsulating form of the encapsulant 130 is not particularly limited, and may be any form as long as it may surround at least a portion of the first connection member 110 or the semiconductor chip 120. For example, the encapsulant 130 may cover the first connection member 110 and the inactive surface of the semiconductor chip 120, and may fill a space between a wall surface of the through hole 110H and the side surfaces of the semiconductor chip 120. In addition, the encapsulant 130 may also fill at least a portion of a space between the passivation film 123 of the semiconductor chip 120 and the second connection member 140. Meanwhile, the encapsulant 130 may fill the through hole 110H to thus reduce buckling while serving as an adhesive, depending on materials of the encapsulant 130.

The encapsulant 130 may include an insulating material. The insulating material may be a material including an inorganic filler and an insulating resin, for example, a thermosetting resin such as an epoxy resin, a thermoplastic resin such as polyimide, or a resin, particularly, an ABF, a FR-4 resin, a BT resin, a PID resin, or the like, in which a stiffener such as an inorganic filler is included in the thermosetting resin and the thermoplastic resin. In addition, a known molding material such as an epoxy molding compound (EMC) may also be used. If necessary, a material, in which a thermosetting resin or a thermoplastic resin is impregnated into a core such as an inorganic filler, glass fiber, glass cloth, or glass fabric, may also be used.

As needed, the void V3 having the at least a portion filled with a portion of the external connection terminal 190 may be present in the wall surfaces of the encapsulant 130 formed by the opening 183 passing through the encapsulant 130. Due to the presence of the void V3, the anchoring effect may be further increased. The encapsulant 130 may include the insulating resin 130a and the filler 130b, and the void V3 may be a recess formed in the encapsulant 130 by removing the at least a portion of the filler 130b dispersed in the encapsulant 130. Meanwhile, the void V3 may be formed by a method of forming a via hole, such as dry and/or wet process, or the like.

The second connection member 140 may allow the connection pad 122 of the semiconductor chip 120 to be redistributed. Several tens to several hundreds of connection pads 122 having various functions may be redistributed by the second connection member 140, and may be physically or electrically connected to an external source by connection terminals 170 to be described below, depending on the functions. The second connection member 140 may include an insulating layer 141, a redistribution layer 142 disposed on the insulating layer 141, and a via 143 passing through the insulating layer 141, and connecting the redistribution layer 142. In the fan-out semiconductor package 100A according to an example, the second connection member 140 may include a single layer, but may also include a plurality of layers. Meanwhile, the void V3 may be formed by a method of forming a via hole, such as dry and/or wet process, or the like.

A material of the insulating layer 141 may be an insulating material. The insulating material may be a photosensitive insulating material such as a PID resin, in addition to the above-mentioned insulating material. For example, the insulating layer 141 may be a photosensitive insulating layer. In the case that the insulating layer 141 has photosensitive properties, the insulating layer 141 may have a further reduced thickness, and a fine pitch of the via 143 may be achieved more easily. The insulating layer 141 may be a photosensitive insulating layer including an insulating resin and a filler. When the insulating layer 141 includes a plurality of layers, materials thereof may be the same as each other, and may also be different from each other, if necessary. When the insulating layer 141 includes a plurality of layers, the layers may be integrated with each other, depending on processes, so that a boundary therebewteen may not be readily apparent.

The redistribution layer 142 may substantially serve to redistribute the connection pad 122. A material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions, depending on a design thereof. For example, the redistribution layer 142 may include a GND pattern, a PWR pattern, a S pattern, or the like. Here, the S pattern may include various signals, for example, data signals, or the like, except for a GND pattern, a PWR pattern, or the like. In addition, the redistribution layer 142 may include a via pad, a connection terminal pad, or the like.

If necessary, a surface treatment layer (not illustrated) may be formed on a surface such as a pad pattern or the like, exposed by an opening 151 formed in a passivation layer 150 to be described later, of the redistribution layer 142 of the second connection member 140. The surface treatment layer (not illustrated) may be formed by, for example, electrolytic gold plating, electroless gold plating, OSP or electroless tin plating, electroless silver plating, electroless nickel plating/substituted gold plating, DIG plating, HASL, or the like.

The via 143 may electrically connect the redistribution layer 142, the connection pad 122, or the like, formed in different layers, to each other, resulting in formation of an electrical path in the electronic component package 100A. A material of the via 143 may also be a conductive material such as copper (Cu), aluminum (Al), silver (Ag), tin (Sn), gold (Au), nickel (Ni), lead (Pb), titanium (Ti), or alloys thereof. The via 143 may be fully filled with the conductive material, or the conductive material may also be formed along the wall surface of the via 143. In addition, the via 143 may have all shapes known in the related art, such as a tapered shape, a cylindrical shape, or the like.

Thicknesses of the first and second redistribution layers 112a and 112b of the first connection member 110 may be greater than that of the redistribution layer 142 of the second connection member 140. The first connection member 110 may have a thickness greater than or equal to that of the semiconductor chip 120, and thus, the first and second redistribution layers 112a and 112b formed in the first connection member 110 may also have greater sizes to suit a scale of the first connection member 110. Conversely, the redistribution layer 142 of the second connection member 140 may be relatively smaller than the first and second redistribution layers 112a and 112b of the first connection member 110, in order to thin the second connection member 140. In a similar aspect, the via 113 of the first connection member 110 may have a greater dimension than that of the redistribution layer 142 of the second connection member 140.

The passivation layer 150 may be an additional component protecting the second connection member 140 from external physical or chemical damage. The passivation layer 150 may have the opening 151 exposing at least a portion of the redistribution layer 142 of the second connection member 140. Such an opening may be formed in the passivation layer 150 in an amount of several tens to several thousands.

A material of the passivation layer 150 is not particularly limited, and may be, for example, a photosensitive insulating material such as a photosensitive insulating resin. Alternatively, the material of the passivation layer 150 may also be a solder resist. Alternatively, the material of the passivation layer 150 may not include a core, but may be an insulating resin including a filler, for example, an ABF or the like including an inorganic filler and an epoxy resin. When an insulating material including an inorganic filler and an insulating resin but not including a core, for example, an ABF or the like is used as the material of the passivation layer 150, the material of the passivation layer 150 may be symmetrical to the resin layer 182, and may allow warpage distribution to be controlled, thus being more effective for warpage control. When an insulating material including an inorganic filler and an insulating resin, for example, an ABF or the like, is used as the passivation layer 150, the insulating layer 141 of the second connection member 140 may also include an inorganic filler and an insulating resin. Here, a weight percentage of the inorganic filler included in the passivation layer 150 may be greater than that of the inorganic filler included in the insulating layer 141 of the second connection member 140. In this case, a coefficient of thermal expansion (CTE) of the passivation layer 150 may be relatively low, which may be utilized for warpage control.

An under-bump metal layer 160 may be an additional component increasing connection reliability of the connection terminals 170, and improving board level reliability of the fan-out semiconductor package 100A. The under-bump metal layer 160 may be connected to the redistribution layer 142 of the second connection member 140 exposed by the opening 151 of the passivation layer 150. The under-bump metal layer 160 may be formed in the opening 151 of the passivation layer 150 by a known metallization method using a known conductive material, for example, a metal, but is not limited thereto.

The connection terminals 170 may be an additional component physically or electrically connecting the fan-out semiconductor package 100A to an external power source. For example, the fan-out semiconductor package 100A may be mounted on the main board of the electronic device by the connection terminals 170. The connection terminals 170 may be formed of a conductive material, for example, a solder or the like. However, this is merely exemplary, and a material of the connection terminals 170 is not limited thereto. The connection terminals 170 may be a land, a ball, a pin, or the like. The connection terminals 170 may include a single layer or a plurality of layers. When the connection terminals 170 include the layers, the connection terminals 170 may include a copper (Cu) pillar and a solder. When the connection terminals 170 include the single layer, the connection terminals 170 may include a tin (Sn)-silver (Ag) solder or copper. However, the connection terminals 170 are merely exemplary, and are not limited thereto.

The number, interval, disposition, or the like, of connection terminals 170 is not particularly limited, and may be sufficiently modified by a person skilled in the art, depending on design particulars. For example, several tens to several thousands of connection terminals 170 may be provided, according to the number of connection pads 122 of the semiconductor chip 120, and connection terminals 170 may also be provided in an amount not less than or not more than several tens to several thousands. The connection terminals 170 may cover a side surface of the under-bump metal layer 160 extending to one surface of the passivation layer 150, and thus, may have further excellent connection reliability.

At least one of the connection terminals 170 may be disposed in a fan-out region. The fan-out region may denote a region except for a region in which the semiconductor chip 120 may be disposed. For example, the fan-out semiconductor package 100A according to an example may be a fan-out package. The fan-out package may have excellent reliability as compared to a fan-in package, may allow a plurality of I/O terminals to be implemented, and may facilitate 3D interconnectivity. In addition, as compared to a ball grid array (BGA) package, a land grid array (LGA) package, or the like, the fan-out package may be mounted on the electronic device without using a separate substrate. Thus, the fan-out package may be manufactured to have a reduced thickness, and may have excellent price competitiveness.

The reinforcing layer 181 may increase the rigidity of the fan-out semiconductor package 100A. In addition, introduction of the reinforcing layer 181 may allow the reliability of the external connection terminal 190 to be increased. The reinforcing layer 181 may have a modulus of elasticity relatively greater than that of the encapsulant 130, and may have a CTE relatively less than that of the encapsulant 130. In this case, a warpage reduction effect may be excellent. The reinforcing layer 181 may include the insulating resin 181a, the core 181b, and the filler 181c. For example, the reinforcing layer 181 may be an unclad copper clad laminate (CCL) or a prepreg. When the reinforcing layer 181 includes the core 181b such as glass fiber, glass cloth, or glass fabric, the modulus of elasticity of the reinforcing layer 181 may be relatively increased, and when the reinforcing layer 181 includes a filler, the CTE of the reinforcing layer 181 may be relatively decreased by adjusting the content of the filler. The reinforcing layer 181 may be bonded to the encapsulant 130 in a cured state (c-stage). In this case, a boundary surface between the encapsulant 130 and the reinforcing layer 181 may be substantially linear, but is not limited thereto. If necessary, the reinforcing layer 181 may be bonded to the encapsulant 130 in a non-cured state (b-stage), and thus, the boundary surface may be substantially nonlinear. The filler 181c may be an inorganic filler such as silica or alumina, and the insulating resin 181a may be a thermosetting resin such as an epoxy resin or a thermoplastic resin such as polyimide.

The voids V1a and V1b may be present in the opening 183 passing through the reinforcing layer 181. In this case, the external connection terminal 190 such as a solder ball formed in the opening 183 may fill the at least portions of the voids V1a and V1b during the reflow process. Portions of the external connection terminal 190, which flow into the voids V1a and V1b, may form the anchoring structure, and thus, the reliability may be increased by preventing the external connection terminal 190 from being separated from the wall surface of the opening 183 even in the harsh environment in which thermal stress or mechanical stress occurs. For example, the reliability at the interface may be increased in a reliability test such as a TCoB test or a drop test. Meanwhile, when the material including the insulating resin 181a, the core 181b, and the filler 181c may be used as the reinforcing layer 181, the at least one of the voids V1a and V1b may be formed by removing the at least a portion of the core 181b, and additionally, the at least the other of the voids V1a and V1b may be formed by removing the at least a portion of the filler 181c. The void V1a formed by removing the core 181b may have a particularly excellent anchoring effect. In addition, in the case of having the void V1b formed by removing the filler 181c, the anchoring effect may be further increased. Meanwhile, the voids V1a and V1b may be formed by a method of forming via holes, such as dry and/or wet process, or the like.

The resin layer 182 may be disposed on the reinforcing layer 181. The resin layer 182 may be formed using an insulating material, for example, an ABF or the like, including the same or a similar material to the encapsulant 130, for example, the insulating resin 182a and the filler 182b, but not including a core. When the reinforcing layer 181 includes a core or the like, it may be difficult to form the opening 183 by the reinforcing layer 181. However, when the resin layer 182 is added, the opening 183 may be easily formed. In this respect, the opening 183 may pass through the resin layer 182, and the void V2 having the at least a portion filled with a portion of the external connection terminal 190 may be present in the wall surfaces of the resin layer 182 through which the opening 183 passes. Due to the presence of the void V2, the anchoring effect may be further increased. The resin layer 182 may include the insulating resin 182a and the filler 182b, and the void V2 may be formed by removing the at least a portion of the filler 182b. The insulating resin 182a may be the thermosetting resin such as the epoxy resin, or the thermoplastic resin such as the polyimide. The filler 182b may be the inorganic filler such as the silica or the alumina. Meanwhile, the void V2 may be formed by a method of forming a via hole, such as dry and/or wet process, or the like.

When the fan-out semiconductor package 100A is used in a POP structure or the like, the external connection terminal 190 may be used for an interconnection with an upper fan-out semiconductor package. Alternatively, when a separate surface mount technology (SMT) component is attached to the fan-out semiconductor package 100A, the external connection terminal 190 may be used. The external connection terminal 190 may be formed of a conductive material, for example, a solder or the like. However, this is merely exemplary, and a material of the external connection terminal 190 is not particularly limited to the conductive material. The shape, number, interval, disposition, or the like of the external connection terminal 190 are not particularly limited. The external connection terminal 190 may fill at least a portion of the opening 183, and may fill at least portions of the voids V1a, V1b, V2, and V3. In this case, reliability of the fan-out semiconductor package 100A may be increased.

Although not illustrated in the drawings, if necessary, a metal layer may further be disposed on the wall surface of the through hole 110H. The metal layer may serve to effectively dissipate heat generated by the semiconductor chip 120. In addition, the metal layer may serve to shield electromagnetic waves. Further, a separate passive component such as a capacitor or an inductor may be disposed in the through hole 110H. Moreover, a plurality of semiconductor chips 120 may be disposed in the through hole 110H. Also, the through hole 110H may be provided as a plurality of through holes 110H, and respective semiconductor chips 120 or passive components may be disposed in the respective through holes 110H. In addition, structures known in the related art may be applied.

Figure 11:
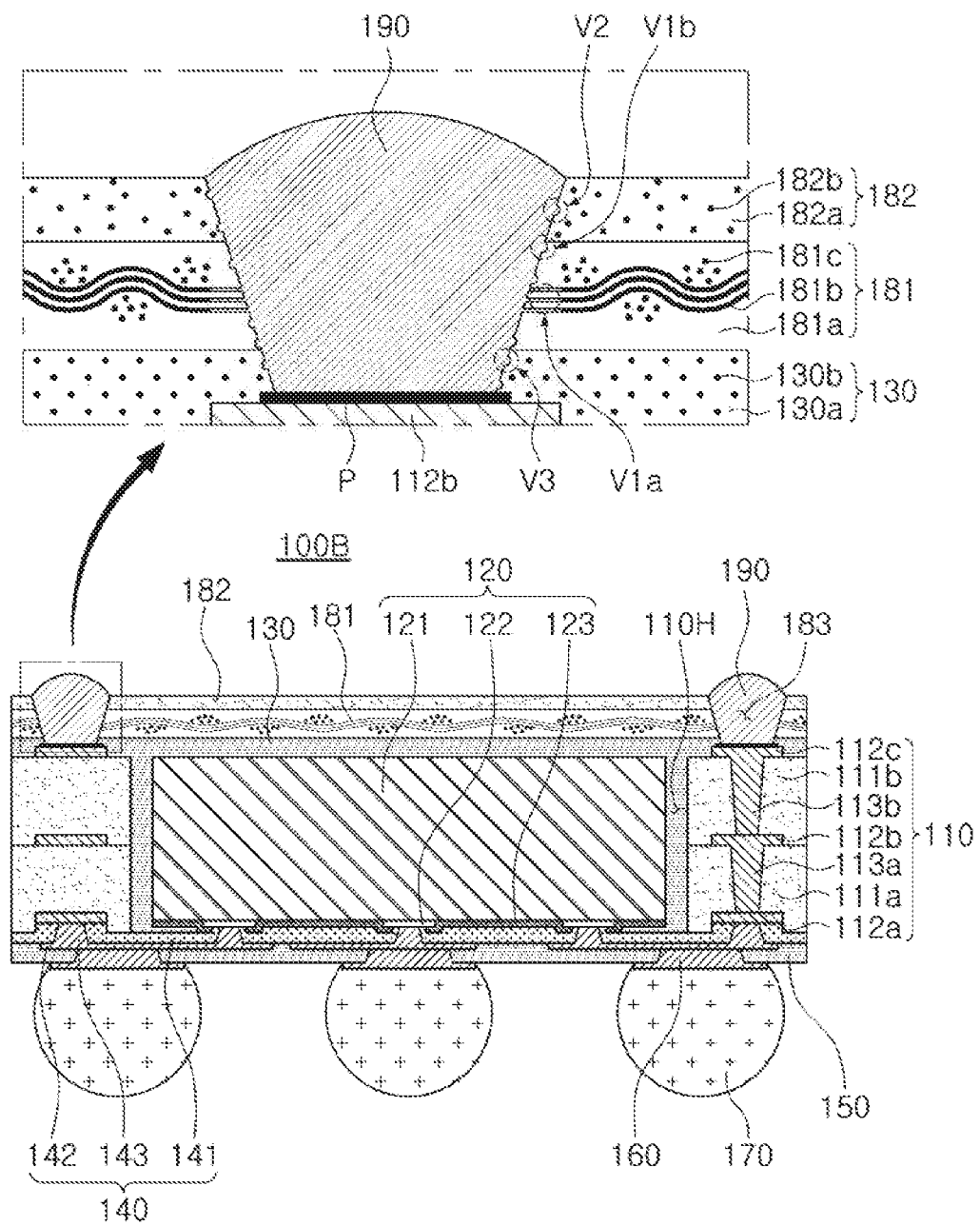
FIG. 11 is a schematic cross-sectional view illustrating an example of a fan-out semiconductor package.

FIG. 11 is a schematic cross-sectional view illustrating an example of a fan-out semiconductor package.

Referring to the drawings, a fan-out semiconductor package 100B according to an example may include a first insulating layer 111a in which a first connection member 110 contacts a second connection member 140, a first redistribution layer 112a contacting the second connection member 140 and embedded in the first insulating layer 111a, a second redistribution layer 112b opposing the first redistribution layer 112a of the first insulating layer 111a, and a third redistribution layer 112c disposed on the first insulating layer 111a, a second insulating layer 111b disposed on the first insulating layer 111a and covering the second redistribution layer 112b, and a third redistribution layer 112c disposed on the second insulating layer 111b. The first to third redistribution layers 112a to 112c may be electrically connected to a connection pad 122 of a semiconductor chip 120. The first and second redistribution layers 112a and 112b may be electrically connected to each other by a first via 113a passing through the first insulating layer 111a, and the second and third redistribution layers 112b and 112c may be electrically connected to each other by a second via 113b passing through the second insulating layer 111b.

Since the first redistribution layer 112a is embedded, an insulating distance of an insulating layer 141 of the second connection member 140 may be substantially constant. The first connection member 110 may include a large number of first to third redistribution layers 112a to 112c, and thus, the second connection member 140 may be further simplified. Thus, degradation of yield due to a defect, generated in a process of forming the second connection member 140, may be alleviated. The first redistribution layer 112a may be recessed inwardly of the first insulating layer 111a, and thus, a lower surface of the first insulating layer 111a and a lower surface of the first redistribution layer 112a may be stepped with each other. As a result, when an encapsulant 130 is formed, a material of the encapsulant 130 may be prevented from polluting the first redistribution layer 112a by bleeding.

The lower surface of the first redistribution layer 112a of the first connection member 110 may be positioned above a lower surface of the connection pad 122 of the semiconductor chip 120. In addition, a distance between the redistribution layer 142 of the second connection member 140 and the first redistribution layer 112a of the first connection member 110 may be greater than that between the redistribution layer 142 of the second connection member 140 and the connection pad 122 of the semiconductor chip 120. This is because the first redistribution layer 112a may be recessed inwardly of the first insulating layer 111a. The second redistribution layer 112b of the first connection member 110 may be positioned between active and inactive surfaces of the semiconductor chip 120. The first connection member 110 may have a thickness corresponding to that of the semiconductor chip 120, and thus, the second redistribution layer 112b formed inside the first connection member 110 may be disposed on a level between the active and inactive surfaces of the semiconductor chip 120.

Thicknesses of the first to third redistribution layers 112a to 112c of the first connection member 110 may be greater than that of the redistribution layer 142 of the second connection member 140. The first connection member 110 may have a thickness greater than or equal to that of the semiconductor chip 120, and thus, the first to third redistribution layers 112a to 112c may also have a greater size to suit a scale of the first connection member 110. Conversely, the redistribution layer 142 of the second connection member 140 may have a relatively reduced size so as to be thinned.

A description of configurations other than the above-mentioned configuration may be substantially the same as that described above, and is thus omitted.

Figure 12:
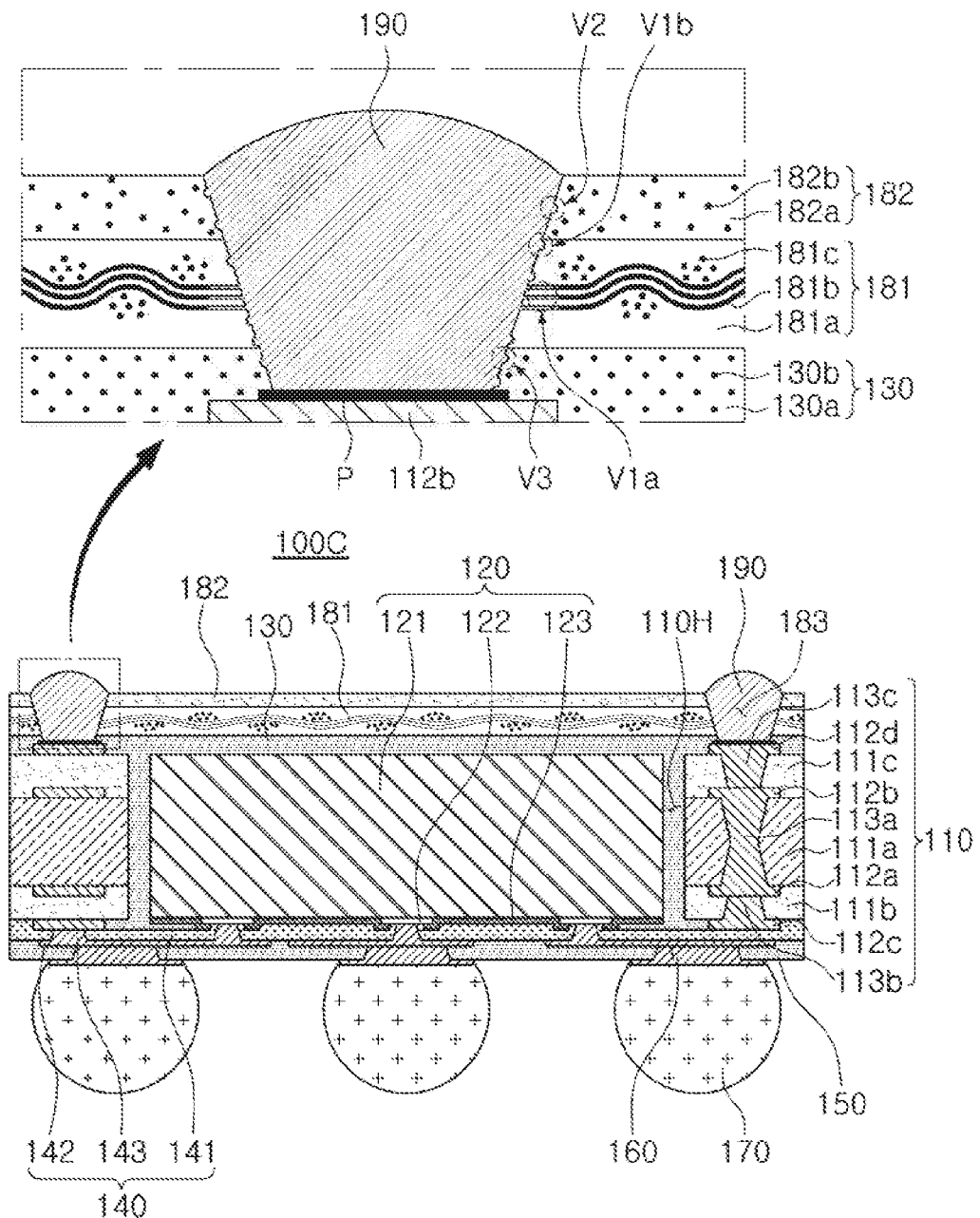
FIG. 12 is a schematic cross-sectional view illustrating an example of a fan-out semiconductor package.

FIG. 12 is a schematic cross-sectional view illustrating an example of a fan-out semiconductor package.

Referring to the drawings, a fan-out semiconductor package 100C according to an example may include a first connection member 110. The first connection member 110 may include a first insulating layer 111a, a first redistribution layer 112a and a second redistribution layer 112b disposed on opposing surfaces of the first insulating layer 111a, a second insulating layer 111b disposed on the first insulating layer 111a to cover the first redistribution layer 112a, a third redistribution layer 112c disposed on the second insulating layer 111b, a third insulating layer 111c disposed on the first insulating layer 111a to cover the second redistribution layer 112b, and a fourth redistribution layer 112d disposed on the third insulating layer 111c. The first to fourth redistribution layers 112a to 112d may be electrically connected to a connection pad 122 of a semiconductor chip 120. The first connection member 110 may include a larger number of first to fourth redistribution layers 112a to 112d, and thus, a second connection member 140 may further be simplified. Thus, degradation of yield due to a defect, generated in a process of forming the second connection member 140, may be alleviated. The first to fourth redistribution layers 112a to 112d may be electrically connected to one another by first to third vias 113a to 113c passing through the first to third insulating layers 111a to 111c.

The first insulating layer 111a may have a thickness greater than those of the second and third insulating layer 111b and 111c. Basically, the thickness of the first insulating layer 111a may be relatively increased to maintain rigidity thereof, and the second and third insulating layer 111b and 111c may be introduced to form larger numbers of third and fourth redistribution layers 112c and 112d. The first insulating layer 111a may include an insulating material different from those of the second and third insulating layers 111b and 111c. For example, the first insulating layer 111a may be, for example, a prepreg including a core, an inorganic filler, and an insulating resin, and the second and third insulating layer 111b and 111c may be an ABF or a photosensitive insulating film including an inorganic filler and an insulating resin, but the first to third insulating layers 111a to 111c are not limited thereto. In a similar aspect, a diameter of the first via 113a may be greater than those of the second and third vias 113b and 113c.

A lower surface of the third redistribution layer 112c of the first connection member 110 may be positioned below a lower surface of the connection pad 122 of the semiconductor chip 120. In addition, a distance between a redistribution layer 142 of the second connection member 140 and the third redistribution layer 112c of the first connection member 110 may be less than that between the redistribution layer 142 of the second connection member 140 and the connection pad 122 of the semiconductor chip 120. This is because the third redistribution layer 112c may be disposed on the second insulating layer 111b to protrude therefrom, resulting in contacting the second connection member 140. The first and second redistribution layers 112a and 112b of the first connection member 110 may be disposed on levels between active and inactive surfaces of the semiconductor chip 120. The first connection member 110 may have a thickness corresponding to that of the semiconductor chip 120, and thus, the first and second redistribution layers 112a and 112b, formed inside the first connection member 110, may be disposed on the levels between the active and inactive surfaces of the semiconductor chip 120.

Thicknesses of the first to fourth redistribution layers 112a to 112d of the first connection member 110 may be greater than that of the redistribution layer 142 of the second connection member 140. The first connection member 110 may have a thickness greater than or equal to that of the semiconductor chip 120, and thus, the first to fourth redistribution layers 112a to 112d may also have a size greater than that of the first connection member 110. Conversely, the redistribution layer 142 of the second connection member 140 may to have a relatively reduced size so as to be thinned.

A description of configurations other than the above-mentioned configuration may be substantially the same as that describing the fan-out semiconductor package 100A according to an example, and is thus omitted.

Figure 13:
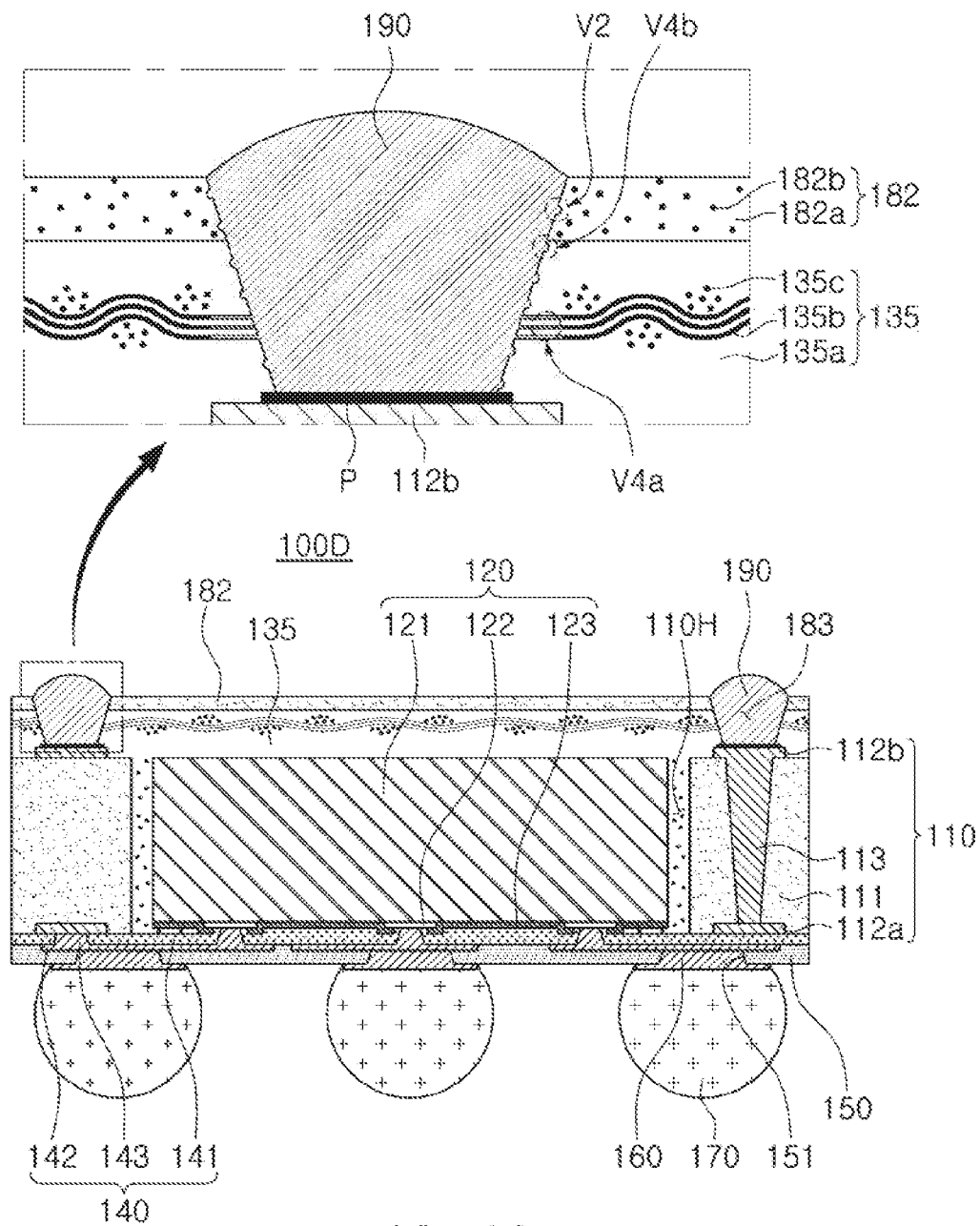
FIG. 13 is a schematic cross-sectional view illustrating an example of a fan-out semiconductor package.

FIG. 13 is a schematic cross-sectional view illustrating an example of a fan-out semiconductor package.

Referring to the drawings, a fan-out semiconductor package 100D according to an example may include an encapsulant 135 containing an insulating resin 135a, a core 135b, and a filler 135c, instead of the reinforcing layer 181. The encapsulant 135 may include the core 135b to thus serve as the reinforcing layer 181. The insulating resin 135a may be a thermosetting resin such as an epoxy resin or a thermoplastic resin such as polyimide, the core 135b may be glass fiber, glass cloth, or glass fabric, and the filler 135c may be an inorganic filler such as silica or alumina, but the insulating resin 135a, the core 135b, and the filler 135c are not limited thereto. As an example, the encapsulant 135 may be formed using a GC material that may include an insulating layer containing an insulating resin, a core, or a filler, a cover film such as an oriented polypropylene (OPP) film covering one surface of the insulating layer, and a base film such as a polyethylene terephthalate (PET) film covering the other surface of the insulating layer. Alternatively, the encapsulant 135 may also be formed using a GCP material that may include an insulating layer containing an insulating resin, a core, or a filler, a cover film such as an OPP film covering one surface of the insulating layer, a primer layer such as a metal layer covering the other surface of the insulating layer, and a base film such as a PET film having one surface covered by the primer layer.

Meanwhile, a material of the encapsulant 135 may encapsulate a first connection member 110 or a semiconductor chip 120 in a non-cured state. Thus, the insulating resin 135a and the filler 135c may be disposed in a space between wall surfaces of a through hole 110H and side surfaces of the semiconductor chip 120, as well as on the first connection member 110 and the inactive surface of the semiconductor chip 120. The core 135b may be disposed only on the first connection member 110 and the inactive surface of the semiconductor chip 120. Since the encapsulant 135 includes the core 135b, rigidity of the fan-out semiconductor package 100D may be retained. Since the encapsulant 135 includes the filler 135c, a coefficient of thermal expansion of the fan-out semiconductor package 100D may be adjusted.

Meanwhile, the opening 183 may pass through the encapsulant 135, and surface roughness of a wall surface of the opening 183 may be greater than that of an exposed surface of a pad disposed on the second redistribution layer 112b connected to an external connection terminal 190. Thus, connecting force between the wall surface of the opening 183 and the external connection terminal 190 may be increased, resulting in an improvement in reliability at an interface between the pad and the external connection terminal 190 in a reliability test such as a TCoB test or a drop test.

Meanwhile, in order to relatively increase the surface roughness of the wall surface of the opening 183, voids V4a and V4b may be formed in the opening 183 passing through the encapsulant 135. In this case, the external connection terminal 190 such as a solder bump formed in the opening 183 may fill at least portions of the voids V4a and V4b during a reflow process. Portions of the external connection terminal 190, which flows into the voids V4a and V4b, may form an anchoring structure, and thus, the reliability at the interface may be increased by preventing the external connection terminal 190 from being separated from the wall surface of the opening 183 even in a harsh environment in which thermal stress or mechanical stress occurs. Meanwhile, the voids V4a and V4b may be formed by a method of forming via holes, such as dry and/or wet process, or the like.

At least one of the voids V4a and V4b may be a recess formed in the core 135b by removing at least a portion of the core 135b, and at least the other of the voids V4a and V4b may be formed in the insulating resin 135a by removing at least a portion of the filler 135c dispersed in the insulating resin 135a. The void V4a, formed by removing the core 135b and having a depth greater than those of any other voids, may allow for a particularly excellent anchoring effect when the portion of the external connection terminal 190 fills deeper than other portions thereof. In addition, the void V4b, formed by removing the filler 135c, may allow the anchoring effect to be further increased.

If necessary, a resin layer 182 may be further disposed on the encapsulant 135. The resin layer 182 may be provided to facilitate easier formation of the opening 183. In this respect, the opening 183 may pass through the resin layer 182, and a void V2 having at least a portion filled with a portion of the external connection terminal 190 may be present in wall surfaces of the resin layer 182 through which the opening 183 passes. Due to the presence of the void V2, the anchoring effect may be further increased. The resin layer 182 may include an insulating resin 182a and a filler 182b, and the void V2 may be formed by removing at least a portion of the filler 182b. The insulating resin 182a may be a thermosetting resin such as an epoxy resin, or a thermoplastic resin such as polyimide. The filler 182b may be an inorganic filler such as silica or alumina.

Meanwhile, if necessary, the above-mentioned GC or GCP material may be used as a material of a passivation layer 150. In this case, cores may be disposed on upper and lower portions of the fan-out semiconductor package 100D, thus being effective to retain rigidity thereof and control warpage thereof.

A description of configurations other than the above-mentioned configuration may be substantially the same as that describing the fan-out semiconductor package 100A according to an example, and is thus omitted.

Figure 14:
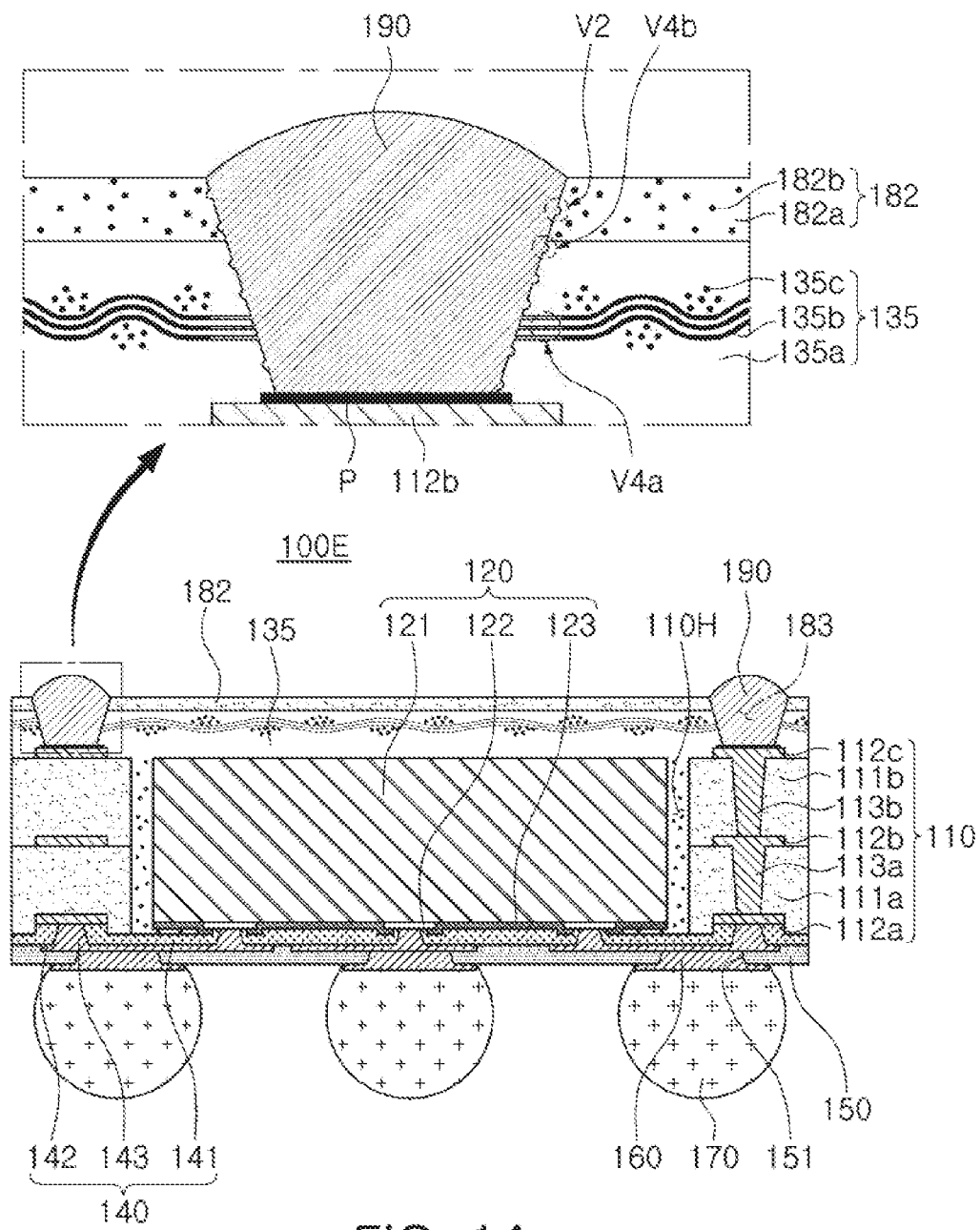
FIG. 14 is a schematic cross-sectional view illustrating an example of a fan-out semiconductor package.

FIG. 14 is a schematic cross-sectional view illustrating an example of a fan-out semiconductor package.

Referring to the drawings, a fan-out semiconductor package 100E according to an example may include a first insulating layer 111a in which a first connection member 110 contacts a second connection member 140, a first redistribution layer 112a contacting the second connection member 140 and embedded in the first insulating layer 111a, a second redistribution layer 112b opposing the first redistribution layer 112a of the first insulating layer 111a, a second insulating layer 111b disposed on the first insulating layer 111a to cover the second redistribution layer 112b, and a third redistribution layer 112c disposed on the second insulating layer 111b. The first to third redistribution layers 112a to 112c may be electrically connected to a connection pad 122. The first and second redistribution layers 112a and 112b may be electrically connected to each other by a first via 113a passing through the first insulating layer 111a, and the second and third redistribution layers 112b and 112c may be electrically connected to each other by a second via 113b passing through the second insulating layer 111b.

A description of configurations other than the above-mentioned configuration may be substantially the same as those described in the fan-out semiconductor package 100A according to an example, the fan-out semiconductor package 100B according to an example, and the fan-out semiconductor package 100D according to an example, and is thus omitted.

Figure 15:
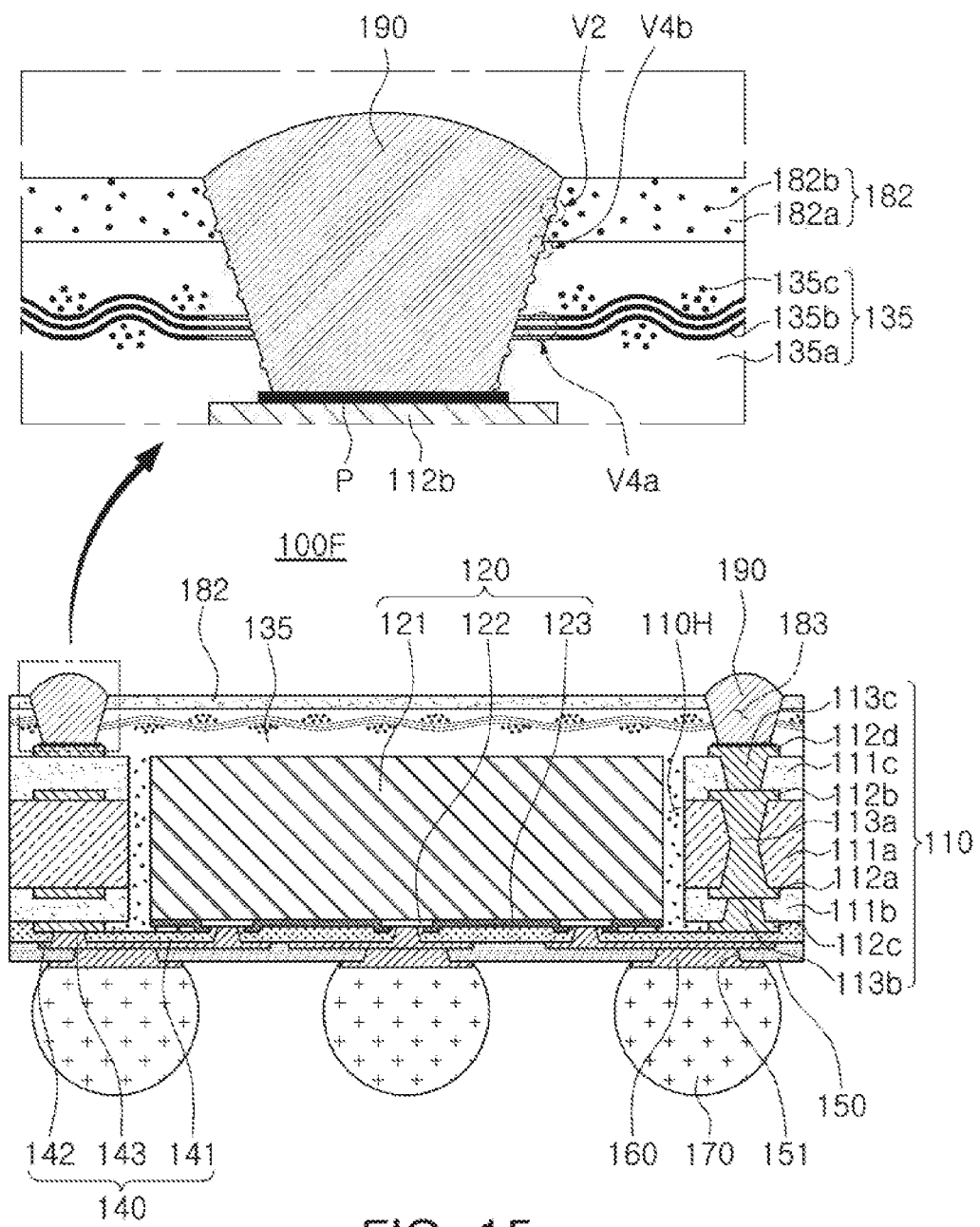
FIG. 15 is a schematic cross-sectional view illustrating an example of a fan-out semiconductor package.

FIG. 15 is a schematic cross-sectional view illustrating an example of a fan-out semiconductor package.

Referring to the drawings, a fan-out semiconductor package 100F according to an example may include a first connection member 110. The first connection member 110 may include a first insulating layer 111a, a first redistribution layer 112a and a second redistribution layer 112b disposed on opposing surfaces of the first insulating layer 111a, a second insulating layer 111b disposed on the first insulating layer 111a to cover the first redistribution layer 112a, a third redistribution layer 112c disposed on the second insulating layer 111b, a third insulating layer 111c disposed on the first insulating layer 111a to cover the second redistribution layer 112b, and a fourth redistribution layer 112d disposed on the third insulating layer 111c. The first to fourth redistribution layers 112a to 112d may be electrically connected to a connection pad 122. The first to fourth redistribution layers 112a to 112d may be electrically connected to one another by first to third vias 113a to 113c passing through the first to third insulating layers 111a to 111c.

A description of configurations other than the above-mentioned configuration may be substantially the same as those described in the fan-out semiconductor package 100A according to an example, the fan-out semiconductor package 100C according to an example, and the fan-out semiconductor package 100D according to an example, and is thus omitted.

As set forth above, according to an exemplary embodiment, a fan-out semiconductor package, in which an external connection terminal formed in an upper portion thereof may have excellent reliability, may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a first connection member having a through hole penetrating through an entirety of the first connection member;
   a semiconductor chip disposed in the through hole, and having an active surface having a connection pad disposed thereon and an inactive surface opposing the active surface;
   a reinforcing layer including an insulating resin and a plurality of cores made of glass fiber, glass cloth, or glass fabric, and disposed on the first connection member and the inactive surface of the semiconductor chip, at least a portion of the plurality of cores is embedded in the insulating resin;
   an encapsulant including a first portion encapsulating at least a portion of the first connection member and disposed between the first connection member and the reinforcing layer, a second portion encapsulating at least a portion of the inactive surface of the semiconductor chip and disposed between the inactive surface of the semiconductor chip and the reinforcing layer, and a third portion continuously extending from the first and second portions of the encapsulant, disposed at least in the through hole, and separating the first connection member and the semiconductor chip from each other, wherein a modulus of elasticity of the encapsulant is less than that of the reinforcing layer;
   a second connection member disposed on the first connection member and the active surface of the semiconductor chip;
   an opening passing through the encapsulant and the reinforcing layer; and
   an external connection terminal filling at least a portion of the opening,
   wherein the first connection member and the second connection member comprise redistribution layers electrically connected to the connection pad of the semiconductor chip, respectively, a redistribution layer of the first connection member comprises a pad having at least a portion exposed by the opening to be connected to the external connection terminal, a wall surface of the opening passing through the encapsulant and the reinforcing layer has surface roughness greater than surface roughness of an exposed surface of the pad, a wall of the opening extending through the reinforcing layer is common with a wall of the opening extending through the encapsulant, the wall of the opening has a plurality of first voids recessed from the wall surface of the opening, each of the plurality of first voids corresponds to each of the plurality of cores, the external connection terminal extends from the wall surface of the opening into each of the plurality of first voids, and sidewalls of each of the plurality of first voids extending from the wall surface of the opening are composed of the insulating resin of the reinforcing layer, and an end surface of each of the plurality of first voids connecting the sidewalls thereof is composed of one of the plurality of cores.

2. The fan-out semiconductor package of claim 1, wherein the reinforcing layer further comprises a filler.

3. The fan-out semiconductor package of claim 2, wherein the insulating resin includes another void, into which the external connection terminal extends from the wall surface of the opening.

4. The fan-out semiconductor package of claim 2, wherein the filler comprises an inorganic filler.

5. The fan-out semiconductor package of claim 1, further comprising:
a resin layer disposed on the reinforcing layer,
wherein the opening passes through the resin layer, and the resin layer comprises a second void, into which the external connection terminal extends from the wall surface of the opening.

6. The fan-out semiconductor package of claim 5, wherein the resin layer comprises an insulating resin and a filler, and at least a portion of the second void is a recess formed in the resin layer.

7. The fan-out semiconductor package of claim 1, wherein the encapsulant comprises a second void, into which the external connection terminal extends from the wall surface of the opening.

8. The fan-out semiconductor package of claim 7, wherein the encapsulant comprises an insulating resin and a filler, and at least a portion of the second void is a recess formed in the encapsulant.

9. The fan-out semiconductor package of claim 1, wherein the first connection member comprises a first insulating layer, a first redistribution layer contacting the second connection member and embedded in the first insulating layer, and a second redistribution layer opposing the first redistribution layer, and the first redistribution layer and the second redistribution layer are electrically connected to the connection pad.

10. The fan-out semiconductor package of claim 9, wherein the first connection member further comprises a second insulating layer disposed on the first insulating layer to cover the second redistribution layer, and the pad is disposed on the second insulating layer, and the pad is electrically connected to the connection pad.

11. The fan-out semiconductor package of claim 1, wherein the first connection member comprises a first insulating layer, a first redistribution layer and a second redistribution layer disposed on opposing surfaces of the first insulating layer, a second insulating layer disposed on the first insulating layer to cover the first redistribution layer, and a third redistribution layer disposed on the second insulating layer, and the first redistribution layer, the second redistribution layer, and the third redistribution layer are electrically connected to the connection pad.

12. The fan-out semiconductor package of claim 11, wherein the first connection member further comprises a third insulating layer disposed on the first insulating layer to cover the second redistribution layer, and the pad is disposed on the third insulating layer, and the pad is electrically connected to the connection pad.

13. The fan-out semiconductor package of claim 1, wherein the external connection terminal includes a solder bump.

14. A fan-out semiconductor package comprising:
a first connection member having a through hole penetrating through an entirety of the first connection member;
a semiconductor chip disposed in the through hole, and having an active surface having a connection pad disposed thereon and an inactive surface opposing the active surface;
a reinforcing layer including an insulating resin and a plurality of cores made of glass fiber, glass cloth, or glass fabric, and disposed on the first connection member and the inactive surface of the semiconductor chip, at least a portion of the plurality of cores is embedded in the insulating resin;
an encapsulant including a first portion encapsulating at least a portion of the first connection member and disposed between the first connection member and the reinforcing layer and the encapsulant, a second portion encapsulating at least a portion of the inactive surface of the semiconductor chip and disposed between the inactive surface of the semiconductor chip and the reinforcing layer, and a third portion continuously extending from the first and second portions of the encapsulant, passing through the through hole, and covering a portion of the active surface, wherein a modulus of elasticity of the encapsulant is less than that of the reinforcing layer;
a second connection member disposed on the first connection member and the active surface of the semiconductor chip; and
an external connection terminal filling at least a portion of an opening of the reinforcing layer,
wherein the first connection member and the second connection member comprise redistribution layers electrically connected to the connection pad of the semiconductor chip, respectively,
a wall surface of the opening of the reinforcing layer comprises a plurality of voids filled with a portion of the external connection terminal, each of the plurality of voids corresponds to each of the plurality of cores,
a wall of the opening extending through the reinforcing layer is common with a wall of the opening extending through the encapsulant, and
sidewalls of each of the plurality of voids extending from the wall surface of the opening are composed of the insulating resin of the reinforcing layer, and an end surface of each of the plurality of voids connecting the sidewalls thereof is composed of one the plurality of cores.

15. The fan-out semiconductor package of claim 14, wherein the reinforcing layer further comprises a filler.

16. The fan-out semiconductor package of claim 14, wherein the external connection terminal includes a solder bump.

17. A fan-out semiconductor package comprising:
a first connection member including a first redistribution layer and having a through hole penetrating through an entirety of the first connection member;
a semiconductor chip disposed in the through hole, and having an active surface having a connection pad disposed thereon and an inactive surface opposing the active surface;
a reinforcing layer including an insulating resin and a plurality of cores made of glass fiber, glass cloth, or glass fabric, and disposed on the first connection member and the inactive surface of the semiconductor chip, at least a portion of the plurality of cores is embedded in the insulating resin;
an encapsulant including a first portion encapsulating at least a portion of the first connection member and the inactive surface of the semiconductor chip disposed between the first connection member and the reinforcing layer, a second portion encapsulating at least a portion of the inactive surface of the semiconductor chip and disposed between the inactive surface of the semiconductor chip and the reinforcing layer, and a third portion continuously extending from the first and second portions of the encapsulant, passing through the through hole, and covering a portion of the active surface, wherein a modulus of elasticity of the encapsulant is less than that of the reinforcing layer;
a second connection member including a second redistribution layer and disposed on the first connection member and the active surface of the semiconductor chip;
an opening passing through the reinforcing layer and the encapsulant to expose a portion of the first redistribution layer and expose recesses disposed in a side surface of the reinforcing layer and the encapsulant facing the opening a first group of the recesses corresponds to each of the plurality of cores and a second group of the recesses does not correspond to the plurality of cores; and
an external connection terminal filling at least a portion of the opening to electrically connect to the portion of the first redistribution layer exposed by the opening,
wherein the first redistribution layer and the second redistribution layer are electrically connected to the connection pad of the semiconductor chip,
the external connection terminal includes a plurality of protrusions filling the recesses,
a wall of the opening extending through the reinforcing layer is common with a wall of the opening extending through the encapsulant,
an insertion depth of protrusions in the first group of the recesses is greater than an insertion depth of other protrusions in the second group of the recesses, and
sidewalls of each of the first group of the recesses extending from a wall surface of the opening are composed of the insulating resin of the reinforcing layer, and an end surface of each of the first group of the recesses connecting the sidewalls thereof is composed of one of the plurality of cores.

18. The fan-out semiconductor package of claim 17, wherein the wall surface of the opening has surface roughness greater than surface roughness of the exposed portion of the first redistribution layer.

19. The fan-out semiconductor package of claim 17, wherein the external connection terminal includes a solder bump.

* * * * *